(12) United States Patent
Yoon et al.

(10) Patent No.: US 9,530,870 B2
(45) Date of Patent: Dec. 27, 2016

(54) METHODS OF FABRICATING A SEMICONDUCTOR DEVICE

(71) Applicant: Samsung Electronics Co., Ltd., Suwon-si (KR)

(72) Inventors: Jieon Yoon, Hwaseong-si (KR); Seokhoon Kim, Suwon-si (KR); Gyeom Kim, Hwaseong-si (KR); Nam-Kyu Kim, Yongin-si (KR); JinBum Kim, Seoul (KR); Dong Chan Suh, Yongin-si (KR); Kwan Heum Lee, Suwon-si (KR); Byeongchan Lee, Yongin-si (KR); Choeun Lee, Pocheon-si (KR); Sujin Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/805,876

(22) Filed: Jul. 22, 2015

(65) Prior Publication Data

US 2016/0027902 A1 Jan. 28, 2016

(30) Foreign Application Priority Data

Jul. 25, 2014 (KR) .................. 10-2014-0094926

(51) Int. Cl.
| | |
|---|---|
| *H01L 29/66* | (2006.01) |
| *H01L 29/78* | (2006.01) |
| *H01L 29/08* | (2006.01) |
| *H01L 21/306* | (2006.01) |
| *H01L 21/8234* | (2006.01) |

(Continued)

(52) U.S. Cl.
CPC ... *H01L 29/66795* (2013.01); *H01L 21/30608* (2013.01); *H01L 21/3247* (2013.01); *H01L 21/823425* (2013.01); *H01L 29/0847* (2013.01); *H01L 29/6656* (2013.01); *H01L 29/66636* (2013.01); *H01L 29/7848* (2013.01); *H01L 21/26506* (2013.01); *H01L 29/045* (2013.01); *H01L 29/165* (2013.01)

(58) Field of Classification Search
CPC ............... H01L 21/26506; H01L 29/66795; H01L 29/6656; H01L 29/045; H01L 29/7848; H01L 29/0847; H01L 29/165
See application file for complete search history.

(56) References Cited

U.S. PATENT DOCUMENTS

| | | |
|---|---|---|
| 6,313,008 B1 | 11/2001 | Leung et al. |
| 7,045,407 B2 | 5/2006 | Keating et al. |

(Continued)

FOREIGN PATENT DOCUMENTS

| | | |
|---|---|---|
| KR | 1020080069424 A | 7/2008 |
| KR | 100874431 B1 | 12/2008 |
| KR | 1020110078100 A | 7/2011 |

*Primary Examiner* — Savitr Mulpuri
(74) *Attorney, Agent, or Firm* — Myers Bigel, P.A.

(57) ABSTRACT

Provided is a method of fabricating a semiconductor device. The method includes forming a gate pattern on a semiconductor substrate, injecting amorphization elements into the semiconductor substrate to form an amorphous portion at a side of the gate pattern, removing the amorphous portion to form a recess region, and forming a source/drain pattern in the recess region. When the recess region is formed, an etch rate of the amorphous portion is substantially the same in two different directions (e.g., <111> and any other direction) of the semiconductor substrate.

16 Claims, 31 Drawing Sheets

(51) Int. Cl.
*H01L 21/324* (2006.01)
*H01L 29/04* (2006.01)
*H01L 21/265* (2006.01)
*H01L 29/165* (2006.01)

(56) References Cited

U.S. PATENT DOCUMENTS

| | | |
|---|---|---|
| 8,232,172 B2 | 7/2012 | Adam et al. |
| 8,637,373 B2 | 1/2014 | Chung et al. |
| 8,841,190 B2 * | 9/2014 | Qin .................. H01L 21/82380 257/255 |
| 2003/0190766 A1 * | 10/2003 | Gonzalez .......... H01L 21/26506 438/57 |
| 2008/0214009 A1 | 9/2008 | Lee et al. |
| 2011/0104875 A1 * | 5/2011 | Wojtczak .......... H01L 21/30608 438/478 |
| 2012/0080723 A1 | 4/2012 | Lee et al. |
| 2012/0315734 A1 | 12/2012 | Yang et al. |

\* cited by examiner

METHODS OF FABRICATING A SEMICONDUCTOR DEVICE

CROSS-REFERENCE TO RELATED APPLICATIONS

This U.S. non-provisional patent application claims priority under 35 U.S.C. §119 to Korean Patent Application No. 10-2014-0094926, filed on Jul. 25, 2014, in the Korean Intellectual Property Office, the entire contents of which are hereby incorporated by reference.

BACKGROUND OF THE INVENTION

Example embodiments of the inventive concept relate to methods of fabricating a semiconductor device.

Semiconductor devices are increasingly being used in consumer, commercial and other electronic devices. The semiconductor devices may be classified into a memory device for storing data, a logic device for processing data, and a hybrid device including both memory and logic elements. Due to the increased demand for electronic devices with fast speed and/or low power consumption, semiconductor devices are needed to provide high reliability, high performance, and/or multiple functions. To satisfy these technical requirements, complexity and/or integration density of semiconductor devices are being increased.

SUMMARY

Example embodiments of the inventive concept provide a method of fabricating a semiconductor device with improved reliability.

Example embodiments of the inventive concept provide a method of fabricating a semiconductor device with an increased operation speed.

According to example embodiments of the inventive concept, a method of fabricating a semiconductor device may include providing a semiconductor substrate, forming an active pattern that protrudes from the semiconductor substrate, forming a gate pattern on the semiconductor substrate to cross the active pattern, forming spacers on sidewalls of the gate pattern, injecting amorphization elements into the active pattern to form amorphous portions in the active pattern at both sides of the gate pattern, etching the amorphous portions to form recess regions in the active pattern, and forming epitaxial patterns in the recess regions.

In example embodiments, each of the recess regions may include a bottom surface having a {100} crystal plane, side surfaces having a {110} crystal plane, lower inclined surfaces having a {111} crystal plane and being provided between the bottom surface and the side surfaces, and upper inclined surfaces having a {111} crystal plane and being provided on the side surfaces.

In example embodiments, a vertical length of respective ones of the side surfaces may be longer than a distance between both ends of respective ones of the lower inclined surfaces, and the both ends of respective ones of the lower inclined surfaces meets the side and bottom surfaces, respectively.

In example embodiments, the etching of the amorphous portions may be performed in such a way that an etch rate of the amorphous portions is substantially the same in <111> and <100> directions of the semiconductor substrate.

In example embodiments, the etching of the amorphous portions may be performed in such a way that an etch rate of the amorphous portions is substantially the same in <111> and <110> directions of the semiconductor substrate.

In example embodiments, in each of the recess regions, the lower inclined surfaces may be connected to each other through the bottom surface interposed therebetween.

In example embodiments, in each of the recess regions, the upper inclined surfaces may be connected to the lower inclined surfaces through the side surfaces interposed therebetween.

In example embodiments, the forming of the recess regions in the active pattern may include forming preliminary recess regions in the active pattern at both sides of the gate pattern, the preliminary recess regions having side surfaces extending along side surfaces of the spacers, and isotropically etching the preliminary recess regions to increase widths of the preliminary recess regions.

In example embodiments, the epitaxial patterns contain the same element as the amorphization elements.

In example embodiments, the amorphization elements may include germanium.

According to example embodiments of the inventive concept, a method of fabricating a semiconductor device may include forming a gate pattern on a semiconductor substrate, forming a spacer on a sidewall of the gate pattern, forming a recess region in the substrate at a side of the spacer, and forming a source/drain pattern in the recess region. The forming of the recess region may include etching the semiconductor substrate using the gate pattern and the spacer as a mask to form a first recess region, injecting an amorphization element through the first recess region to form an amorphous portion in the semiconductor substrate, and removing the amorphous portion to form a second recess region having a volume greater than that of the first recess region.

In example embodiments, the second recess region may include a bottom surface having a {100} crystal plane, a side surface having a {110} crystal plane, a lower inclined surface having a {111} crystal plane and being provided between the bottom and side surfaces, and an upper inclined surface having a {111} crystal plane and being provided on the side surface.

In example embodiments, the amorphization element may include germanium.

In example embodiments, the injecting of the amorphization element may be performed at a dose ranging from about $1\times10^{11}$ atoms/cm$^2$ to about $1\times10^{17}$ atoms/cm$^2$.

In example embodiments, the forming of the source/drain pattern may include growing an epitaxial pattern from the substrate exposed by the recess region, and the source/drain pattern may include the same element as the amorphization element.

According to example embodiments of the inventive concept, a method of fabricating a semiconductor device may include forming a pair of gate patterns on a semiconductor substrate;

forming spacers on sidewalls of the gate patterns, forming an amorphous portion in the substrate between the gate patterns, performing a first etching procedure to form a first recess region in the amorphous portion such that a distance between the spacers on the respective gate patterns is about equal to a width of the first recess region, and performing a second etching procedure to form a second recess region by removing the amorphous portion that remains after the first etching procedure such that the distance between the spacers on the respective gate patterns is less than a width of the second recess region.

In example embodiments, the performing a second etching procedure may include forming the second recess region in a space between the spacers on the respective gate patterns and the substrate.

In example embodiments, the second recess region may include a bottom surface, side surfaces, lower inclined surfaces between the bottom surface and side surfaces, and upper inclined surfaces on the side surfaces. In example embodiments, the first and second etching procedures may be performed in such a way that an etch rate of the amorphous portions is substantially the same in <111> and <100> directions of the semiconductor substrate.

In example embodiments, the etching of the first and second etching procedures may be performed in such a way that an etch rate of the amorphous portions is substantially the same in <111> and <110> directions of the semiconductor substrate.

Other methods, systems, and/or devices according to embodiments of the inventive subject matter will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1A through 7A are perspective views illustrating a method of fabricating a semiconductor device according to example embodiments of the inventive concept.

FIGS. 1B through 7B are sectional views taken along lines A-A' and B-B' of FIGS. 1A through 7A, respectively.

FIGS. 8A through 13A are perspective views illustrating a method of fabricating a semiconductor device according to example embodiments of the inventive concept.

FIGS. 8B through 13B are sectional views taken along lines A-A' and B-B' of FIGS. 8A through 13A, respectively.

Figure 1A:
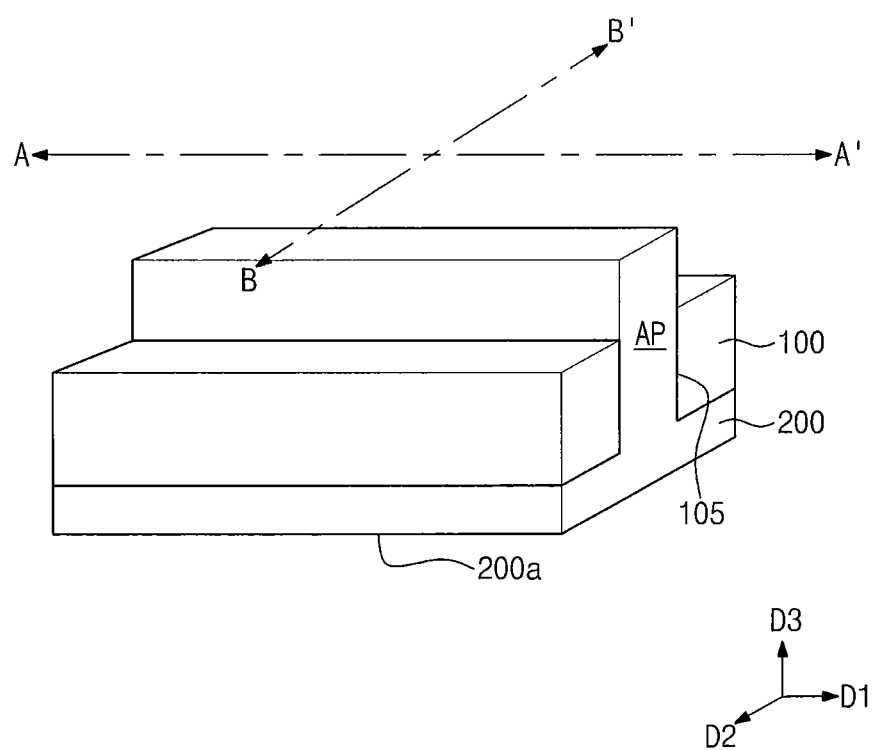

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and device structures thereon, as would be illustrated by a plan view of the device/structure.

FIGS. 1A through 7A are perspective views illustrating a method of fabricating a semiconductor device according to example embodiments of the inventive concept. FIGS. 1B through 7B are sectional views taken along lines A-A' and B-B' of FIGS. 1A through 7A, respectively. FIGS. 5C through 5E are sectional views taken along the line B-B' of FIG. 5A.

Figure 1B:
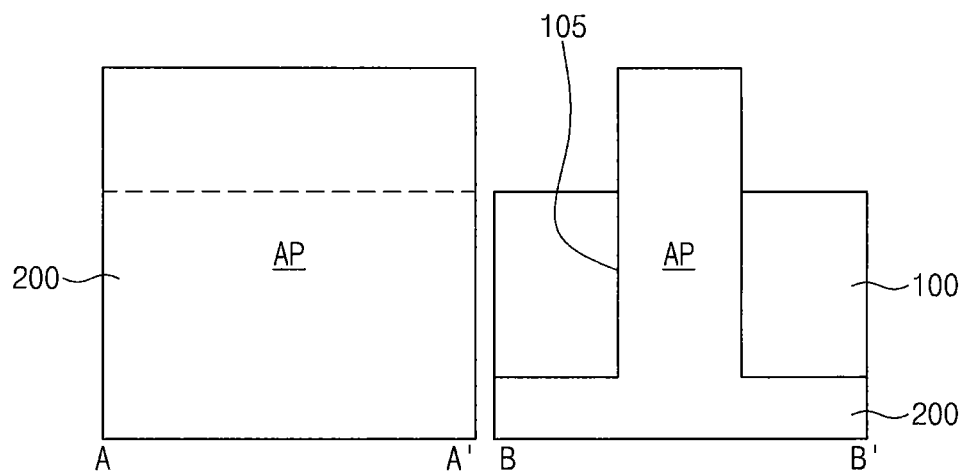

Referring to FIGS. 1A and 1B, a substrate 200 may be patterned to form an active pattern AP. The active pattern AP may extend parallel to a first direction D1. Here, the first direction D1 may be parallel to a top surface of the substrate 200. The substrate 200 may be a semiconductor substrate (e.g., a silicon wafer). The substrate 200 may be formed to have a crystalline lattice structure. For example, the substrate 200 may have {100}, {110}, and {111} crystal planes. The {100} crystal plane of the substrate 200 may be parallel to a bottom surface 200a of the substrate 200, the {110} crystal plane of the substrate 200 may be parallel to the top surface of the substrate 200, and the {111} crystal plane of the substrate 200 may be at an angle to the top surface of the substrate 200. The substrate 200 may be doped to have a first conductivity type. The active pattern AP may be a portion of the substrate 200. As an example, the formation of the active pattern AP may include forming a mask layer on the substrate 200 and etching the substrate 200 using the mask layer as an etch mask to form a trench 105.

A device isolation pattern 100 may be formed in the trench 105 to cover at least a portion of both sidewalls of the active pattern AP. The device isolation pattern 100 may be formed to expose an upper portion of the active pattern AP. The device isolation pattern 100 may be formed by a shallow trench isolation (STI) process. The device isolation pattern 100 may be locally formed in the trench 105. The device isolation pattern 100 may be formed of or include a high-density plasma (HDP) oxide layer, a spin on glass (SOG) layer, and/or a CVD oxide layer.

Figure 2A:
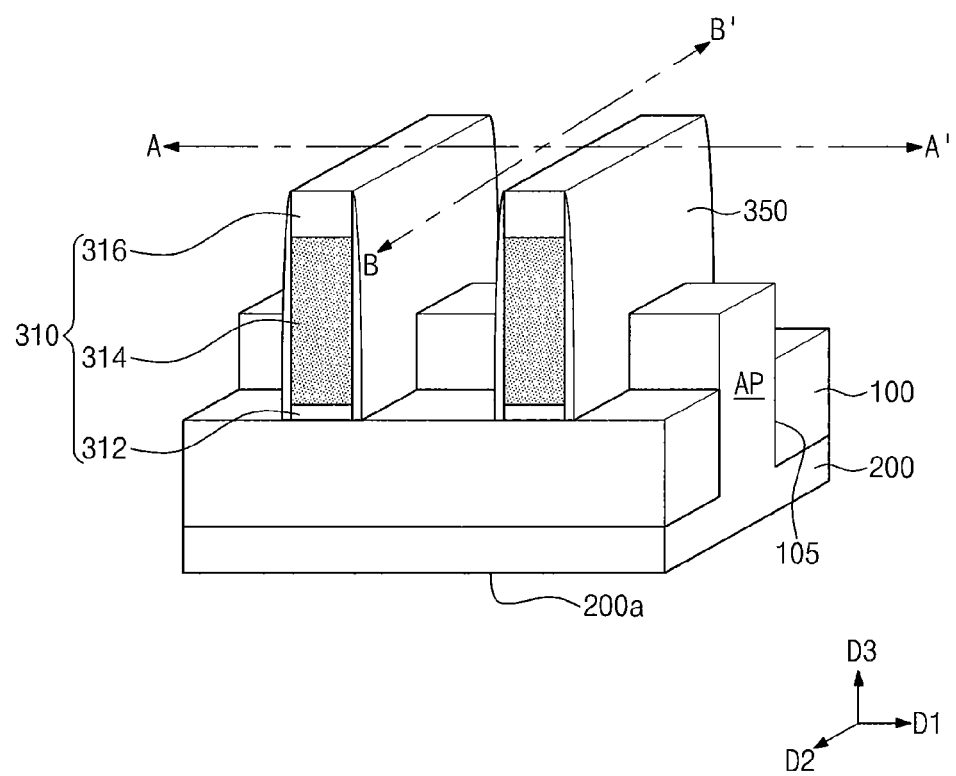
Figure 2B:
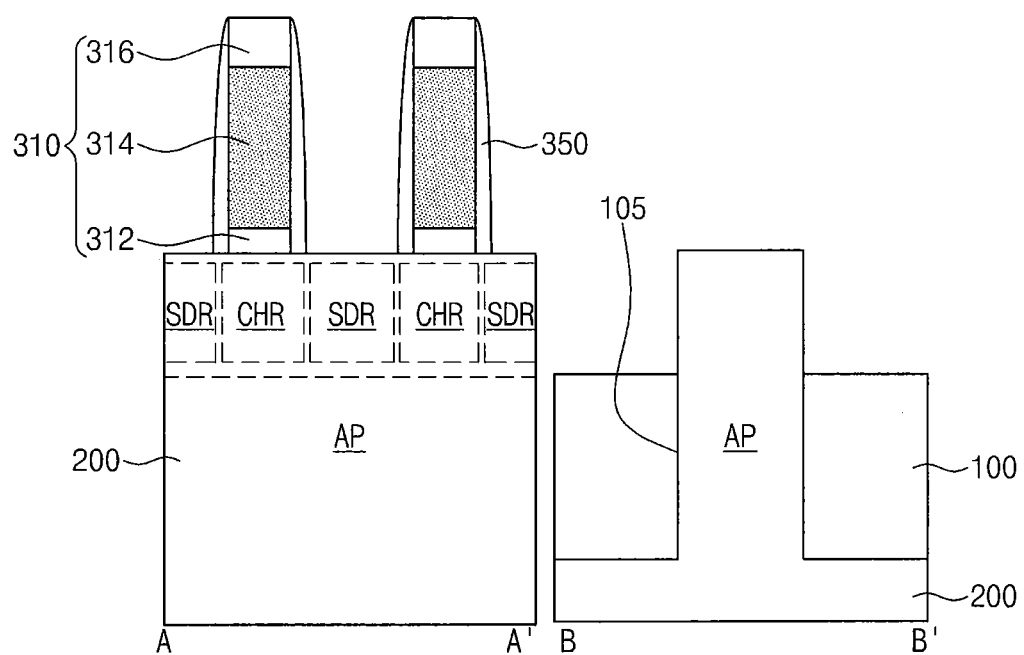

Referring to FIGS. 2A and 2B, gate patterns 310 may be formed on the substrate 200. The gate patterns 310 may cross the active pattern AP and extend along a second direction D2. Here, the direction D2 may be parallel to the top surface of the substrate 200 and across the first direction D1. The gate patterns 310 may be disposed on a channel region CHR of the active pattern AP. Each of the gate patterns 310 may include an etch stop pattern 312, a sacrificial gate pattern 314, and a gate mask pattern 316, which are sequentially stacked on the substrate 200. The etch stop pattern 312 may be include, for example, silicon oxide. The sacrificial gate pattern 314 may include poly silicon, and the gate mask pattern 316 may include silicon nitride. Spacers 350 may be formed on the substrate 200 to cover both side surfaces of the gate patterns 310. Each of the spacers 350 may include at least one insulating material (e.g., silicon nitride or silicon oxide). The formation of the spacers 350 may include forming a spacer layer on the substrate 200 to conformally cover the gate patterns 310 and etching at least a portion of the spacer layer. A doping process using the gate patterns 310 as a doping mask may be performed to form source/drain regions SDR in both end portions of the active pattern AP. The source/drain regions SDR may be formed to have a second conductivity type. For example, the source/drain regions SDR may be low concentration impurity regions. The source/drain regions SDR may define the channel region CHR in the active pattern AP. For example, in each of the active patterns AP, the channel region CHR may be positioned between the source/drain regions SDR. In some embodiments, the doping process may be performed before the formation of the gate patterns 310. In other embodiments, the doping process for the source/drain regions SDR may not be performed.

Figure 3A:
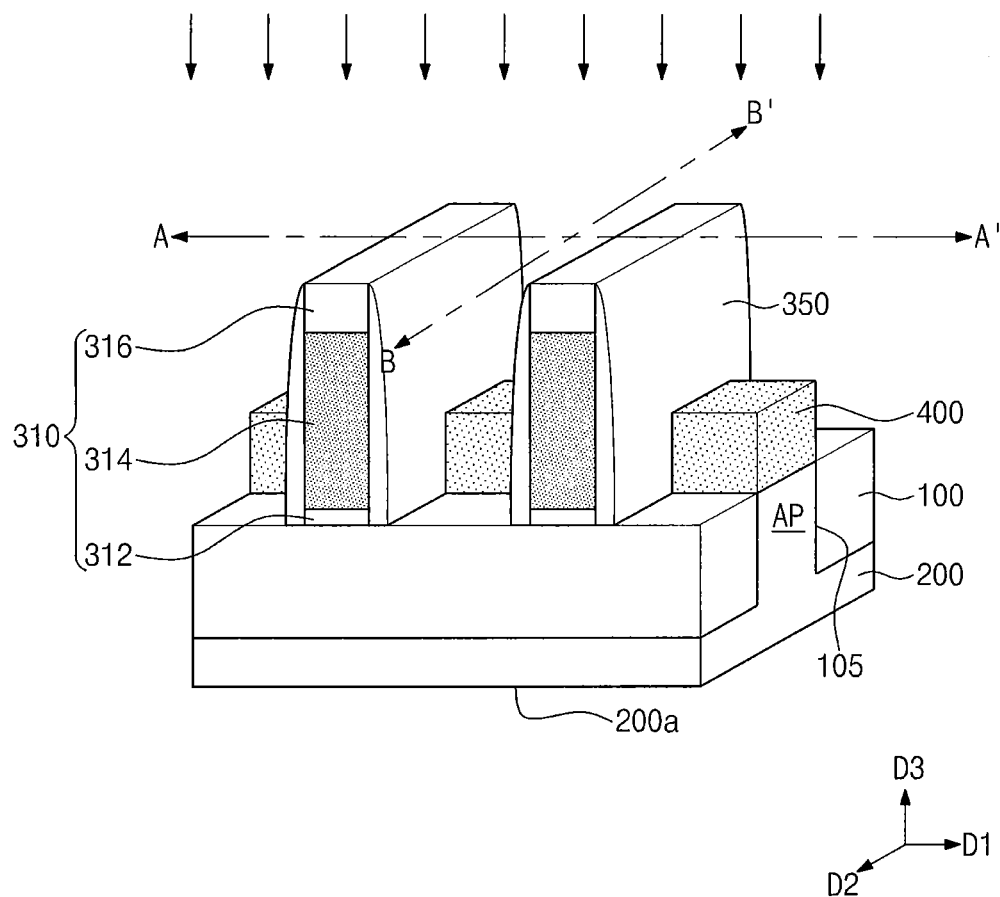
Figure 3B:
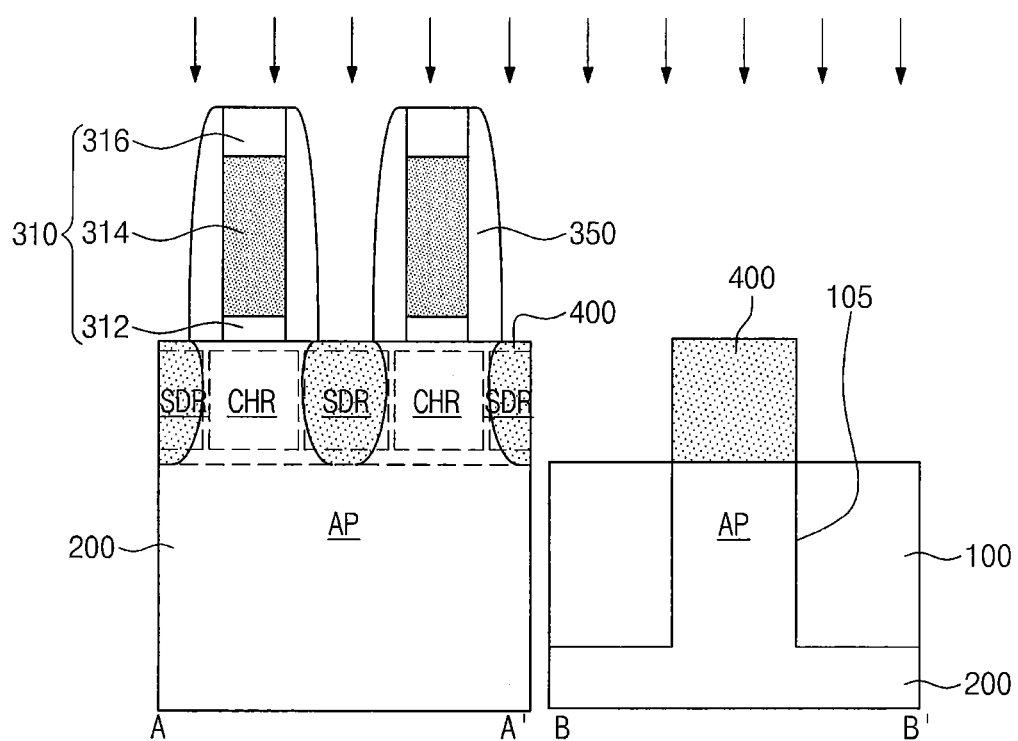

Referring to FIGS. 3A and 3B, amorphous portions 400 may be formed in portions of the substrate 200 positioned at both sides of the gate pattern 310. The amorphous portions 400 may be formed between the gate patterns 310 (e.g., in the source/drain regions SDR). The amorphous portions 400 may be formed by injecting ions of amorphization elements using the gate patterns 310 as an ion-injection mask. As a result of the ion injection process, the amorphous portions 400 may be formed in the substrate 200. In the substrate 200, the amorphization elements may be electrically neutral. In example embodiments, germanium may be used as the amorphization elements. The ion injection process may be performed at a dose ranging from $1 \times 10^{11}$ atoms/cm$^2$ to $1 \times 10^{17}$ atoms/cm$^2$. If the dose is less than $1 \times 10^{11}$ atoms/cm$^2$, it may be difficult to form the amorphous portions 400 sufficiently. A fraction of the amorphization elements may be injected into the spacers 350.

As shown in FIG. 3B, each of the amorphous portions 400 may be formed to have a "U"-shaped section. Alternatively, each of the amorphous portions 400 may be formed to have a rectangle-shaped section. When viewed in a sectional view, a space between adjacent ones of the amorphous portions 400 may be uniform and independent of a distance from the top surface of the substrate 200. At least a portion of the amorphous portion 400 may extend toward a region of the substrate 200 positioned below the spacers 350. For example, side surfaces of the amorphous portions 400 may be positioned below the spacers 350.

The amorphization elements may be injected into the substrate 200 using a vertical or tilted ion implantation process. For example, the injection of the amorphization elements may be performed at a tilted angle with respect to a direction perpendicular to the top surface of the substrate 200.

Figure 4A:
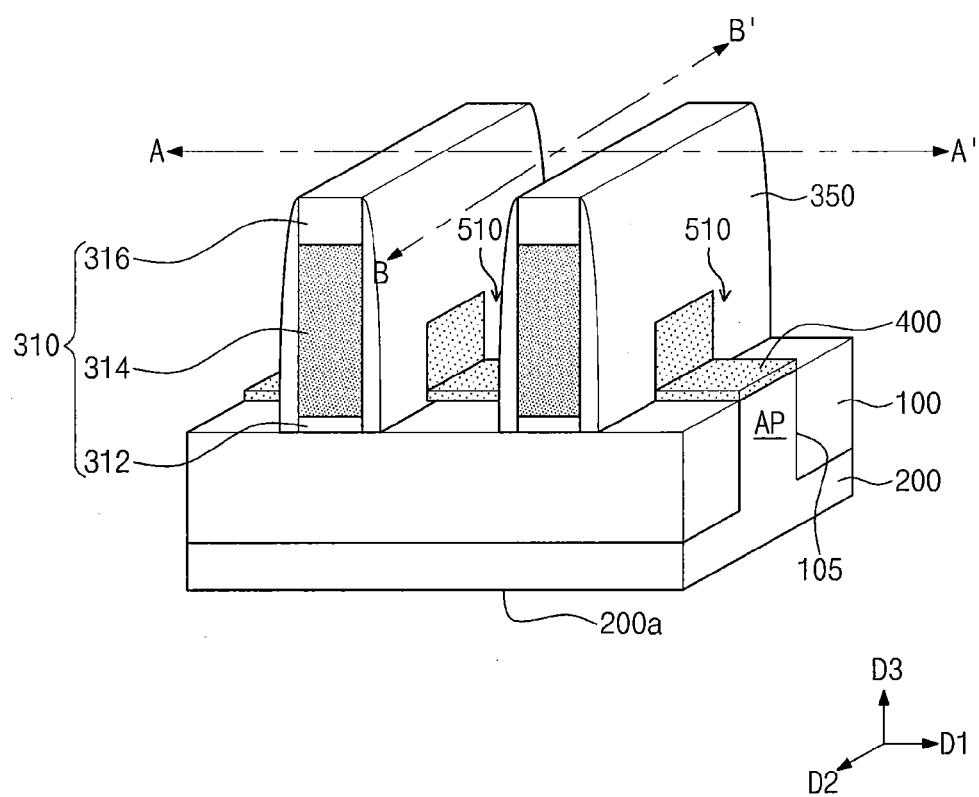
Figure 4B:
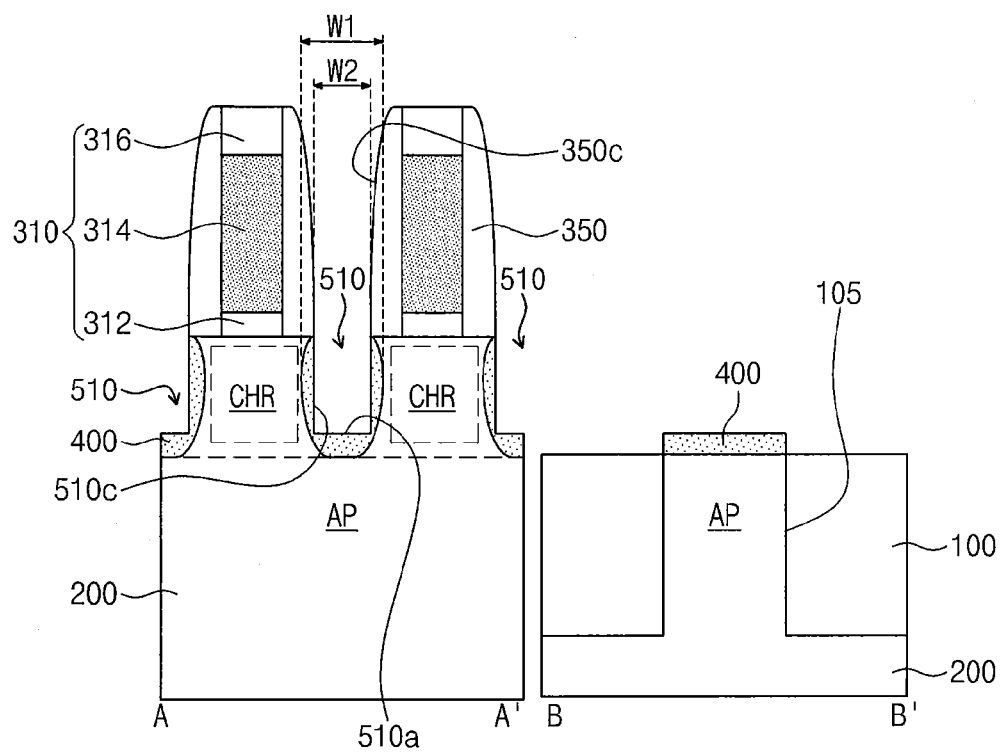

Referring to FIGS. 4A and 4B, a first etching process may be performed on the substrate 200 at both sides of the gate patterns 310 to form recess regions 510. The first etching process may include a dry etching process. Alternatively, an anisotropic etching process using the gate patterns 310 and the spacers 350 as an etch mask may be performed to remove, at least partially, the amorphous portions 400 and form the first recess regions 510. In example embodiments, the etching of the amorphous portions 400 may be perpendicularly performed with respect to the top surface of the substrate 200. The first recess regions 510 may be formed to have side surfaces 510c extending along side surfaces 350c, respectively, of the spacers 350. At the same level, each of the first recess regions 510 may have a width W2 that is smaller than a width W1 of a corresponding one of the amorphous portions 400. For example, after the first etching process, the amorphous portions 400 may partially remain adjacent to the side and bottom surfaces 510c and 510a of the first recess regions 510.

Figure 5A:
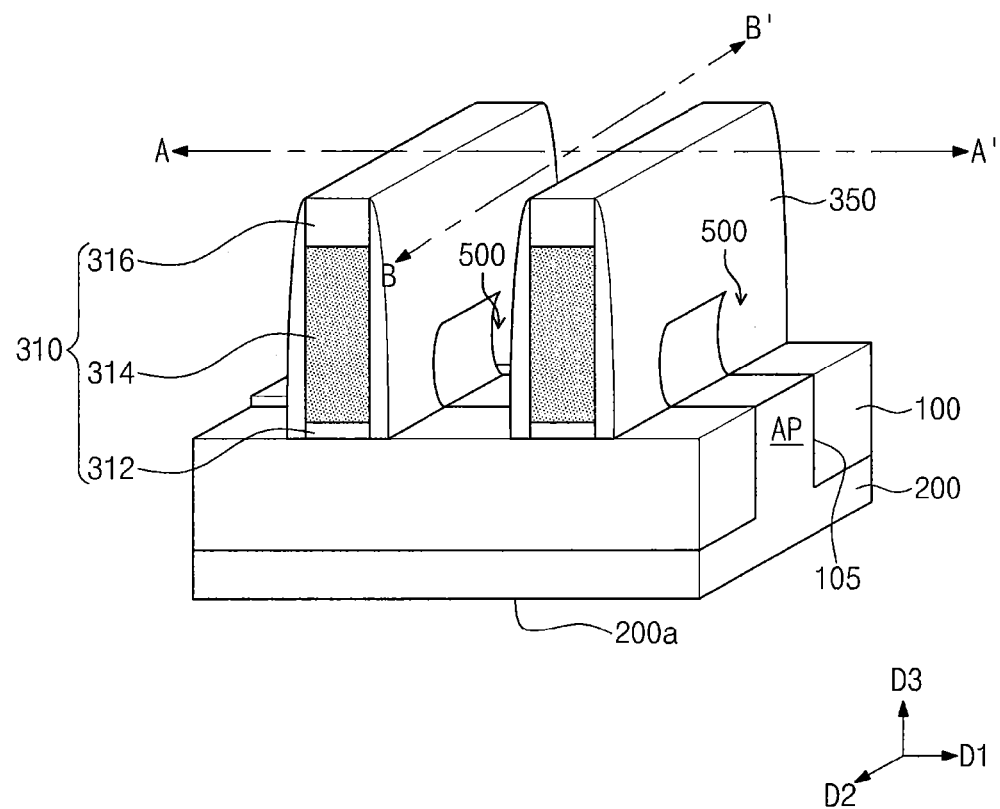
Figure 5B:
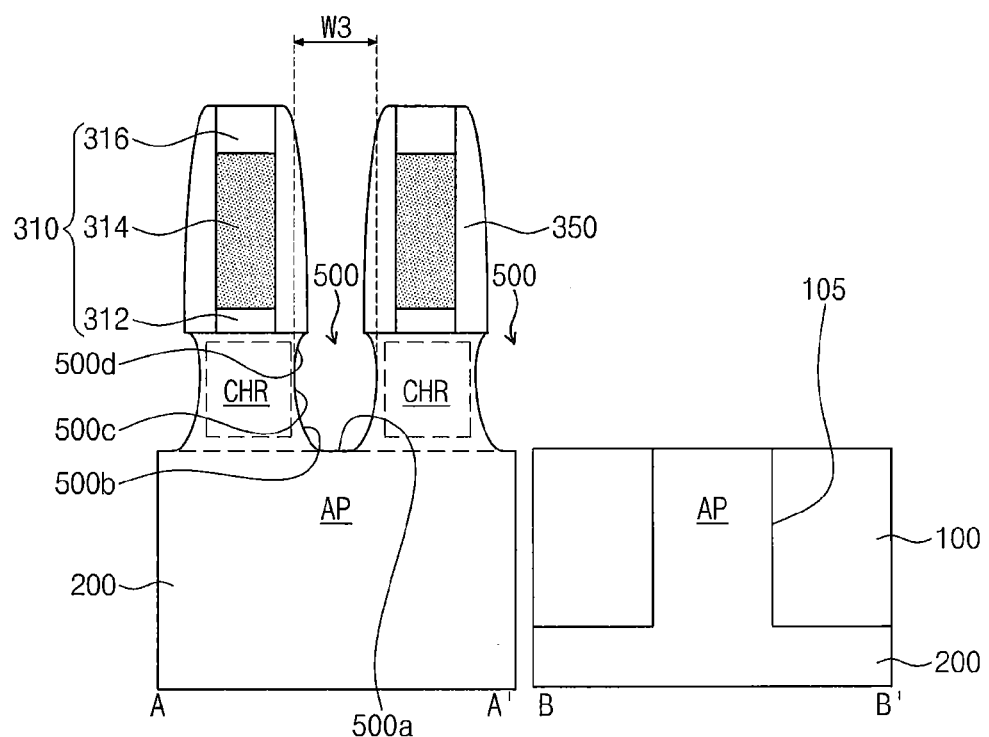

Referring to FIGS. 5A and 5B, a second etching process may be performed to remove the remaining portions of the amorphous portions 400, and thus, second recess regions 500 may be formed in the substrate 200. The second etching process may include a dry etching process and may be performed in the same chamber as that for the first etching process. The second etching process may include an isotropic etching process. For example, the second etching process may be performed to increase a width of each of the first recess regions 510. Accordingly, at the same level, one of the second recess regions 500 may have a width W3 that is larger than the width W1 of a corresponding one of the first recess regions 510. For example, the second etching process may be performed to expand the second recess regions 500 into regions below the spacers 350. Each of the second recess regions 500 may include a bottom surface 500a, side surfaces 500c, lower inclined surfaces 500b, and upper inclined surfaces 500d. A bottom surface 500a may have {100} crystal plane, the side surfaces 500c may have {110} crystal plane, and the inclined surfaces 500b and 500d may have {111} crystal plane. The lower inclined surfaces 500b may be positioned between the bottom surface 500a and the side surfaces 500c. The upper inclined surfaces 500d may be positioned on the side surfaces 500c. The second recess regions 500 may have surfaces, whose crystal planes are different from those of the surfaces 500a, 500b, 500c, and 500d.

An etch rate of the substrate 200 may be changed depending on the crystal planes of the surfaces thereof. For example, an etch rate of the {111} crystal plane of the substrate 200 may be much lower than those of the {100} and {110} crystal planes of the substrate 200. In the case where the amorphous portions 400 are not provided, the {111} crystal plane of the substrate 200 may be used as an etch stop surface during the second etching process. Accordingly, a shape of each of the second recess regions 500 may be defined by the inclined surfaces 500b and 500d with the {111} crystal plane. In the case where the lower inclined surfaces 500b meet each other, a bottom portion of the second recess region 500 may have a 'V'-shaped profile. Alternatively, in the case where the upper and lower inclined surfaces 500d and 500b of the second recess regions 500 meet each other directly, a side portion of the second recess region 500 may have a 'V'-shaped profile, without the side surfaces 500c with the {110} crystal plane.

According to example embodiments of the inventive concept, unlike the substrate 200, the amorphous portions 400 may be isotropically etched. For example, the etching of the amorphous portions 400 may be performed without any dependence on etching direction. In other words, an etch rate of the amorphous portions 400 may be substantially the same in all <111>, <100>, and <110> directions of the substrate 200. Accordingly, a shape of each of the second recess regions 500 may be dependent on not only the {111} crystal plane but also the and {110} crystal planes. In certain embodiments, bottom and side portions of each second recess region 500 may not have a 'V'-shaped profile. For example, bottom and side portions of each second recess region 500 may be formed to have a flat or round profile. As an example, the bottom surface 500a may have the {100} crystal plane between the lower inclined surfaces 500b, and thus, the lower inclined surfaces 500b may not meet each other directly. The side surfaces 500c may have the {110} crystal plane and may be formed between the upper and lower inclined surfaces 500d and 500b. Accordingly, the upper inclined surfaces 500d may not meet the lower inclined surfaces 500b directly. As a result of the formation of the amorphous portions 400, the second recess regions 500 may be further recessed toward the inclined surfaces thereof (e.g., the <111> direction of the substrate 200). The second recess regions 500 may be formed to have a 'U'-shaped section. This makes it possible to increase a volume of the second recess region 500. Further, distances between adjacent ones of the second recess regions 500 may be substantially uniform, and independent of a distance from the top surface of the substrate 200.

As an example, the second recess region 500 may have a shape corresponding to that of the amorphous portion 400. Accordingly, by controlling the shapes of the amorphous portions 400, it is possible to control the shapes of the second recess regions 500. After the process of etching the recess 510, a cleaning process may be further performed on the substrate 200 to remove the amorphous portions 400 remaining on the substrate 200. In other example embodiments, after the etching of the amorphous portions 400, a portion of the substrate 200 below the amorphous portion 400 may be further etched.

Figure 5C:
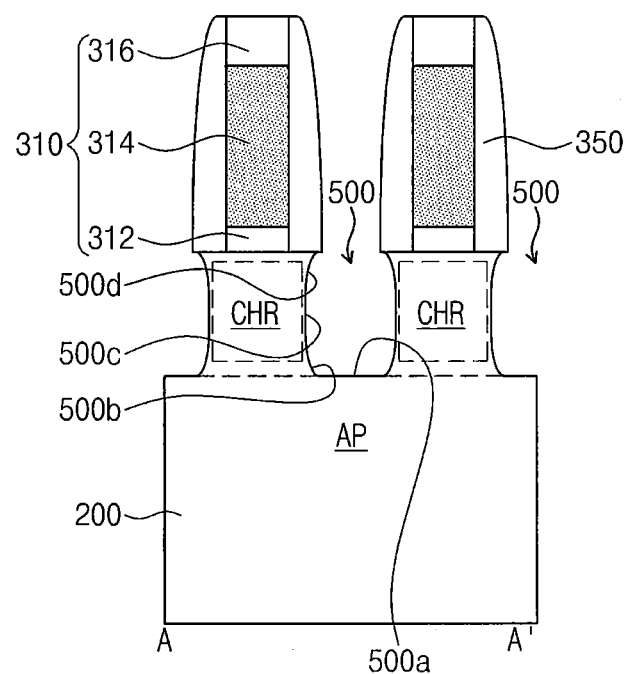
FIGS. 5C through 5E are sectional views taken along lines A-A' and B-B' of FIG. 5A to illustrate modified examples of a recess region.
Figure 5D:
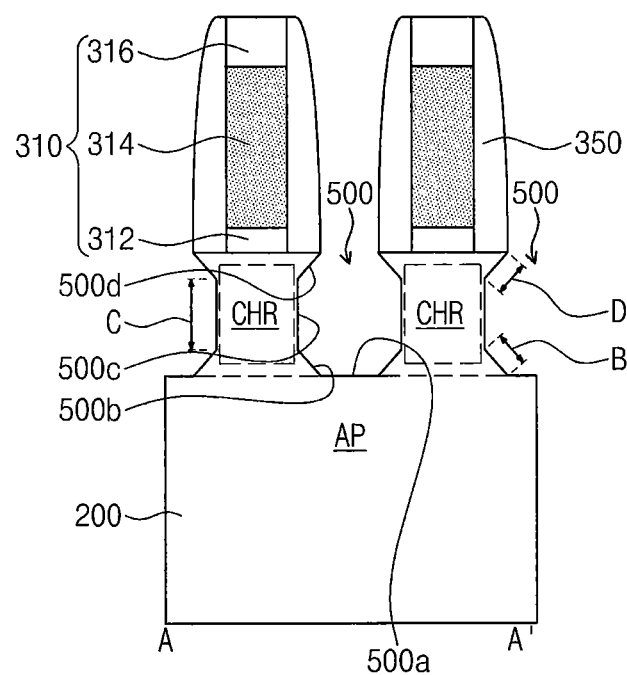
Figure 5E:
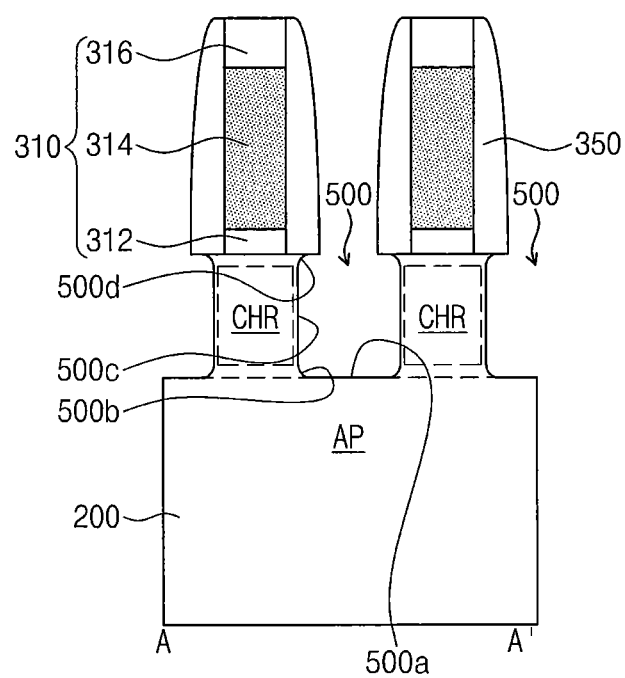

FIGS. 5C through 5E are sectional views taken along lines A-A' and B-B' of FIG. 5A to illustrate modified examples of a recess region. For concise description, a previously described element may be identified by a similar or identical reference number without repeating an overlapping description thereof.

Referring to FIG. 5C, the second recess region 500 may have flat side surfaces 500c and a flat bottom surface 500a. The second recess region 500 may be formed in such a way that the lower inclined surfaces 500b do not meet each other. For example, the bottom surface 500a may be provided between the lower inclined surfaces 500b, and a crystal plane thereof may have {100}. Further, the second recess region 500 may be formed in such a way that the upper inclined surfaces 500d do not meet the lower inclined surfaces 500b directly. The side surfaces 500c of the recess regions 500 may be provided between the upper and lower inclined surfaces 500d and 500b, and a crystal plane thereof may have {110}.

Referring to FIG. 5D, each of the second recess regions 500 may have an octahedron-like shape. A vertical length C of the side surface 500c may be longer than a distance B between both ends of the lower inclined surface 500b. Here, the vertical length C of the side surface 500c may be defined as a distance between a first position, at which the side surface 500c and the upper inclined surface 500d meet each other, and a second position, at which the side surface 500c and the lower inclined surface 500b meet each other. An end of the lower inclined surface 500b may meet the side surface 500c, and an opposite end of the lower inclined surface 500b may meet the bottom surface 500a. The vertical length C of the side surface 500c may be longer than a distance D between both ends of the upper inclined surface 500d. Here, an end of the upper inclined surface 500d may meet the side surface 500c, and an opposite end of the upper inclined surface 500d may meet the top surface of the substrate 200. The side surfaces 500c of the second recess regions 500 may be positioned below the spacers 350, respectively.

Referring to FIG. 5E, each of the second recess regions 500 may have a rectangle-like shape. For example, each of the second recess regions 500 may have the side surfaces 500c with the {110} crystal plane and the bottom surface 500a with the {100} crystal plane. The side surfaces 500c may be formed to face each other and be substantially parallel to each other. The second recess region 500 may be formed in such a way that the inclined surfaces 500b and 500d have very short lengths. In certain embodiments, the second recess region 500 may be formed not to have any inclined surface. In other words, a width or length of the channel region CHR may be substantially uniform, without any dependence on a vertical level.

Figure 6A:
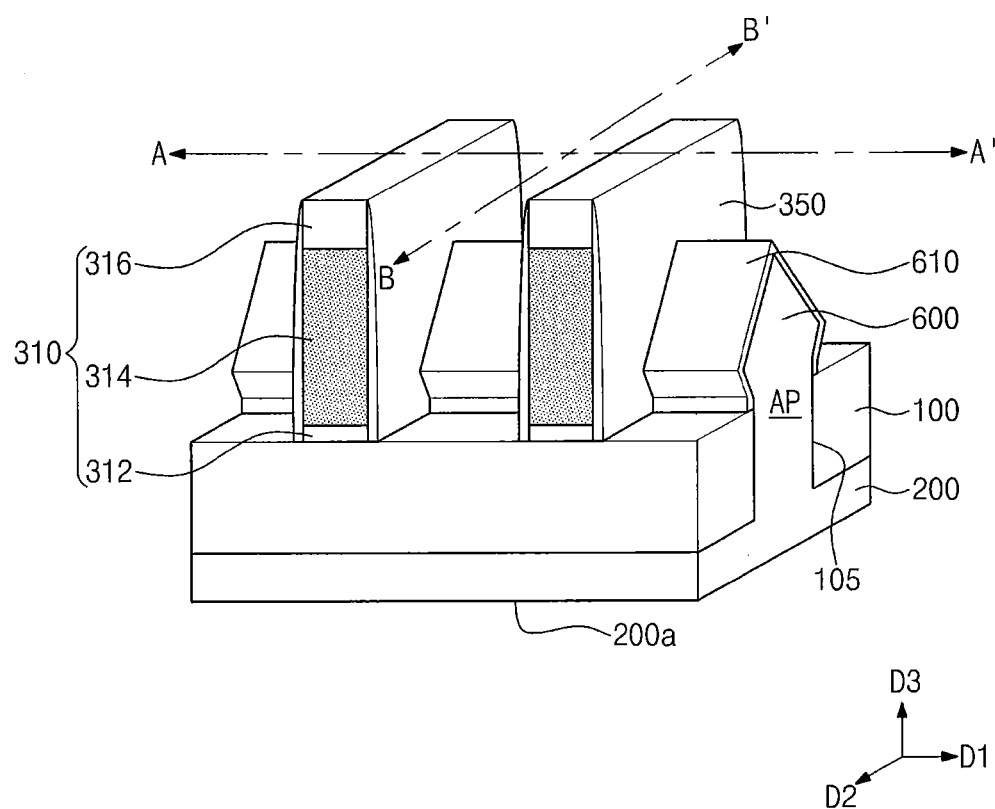
Figure 6B:
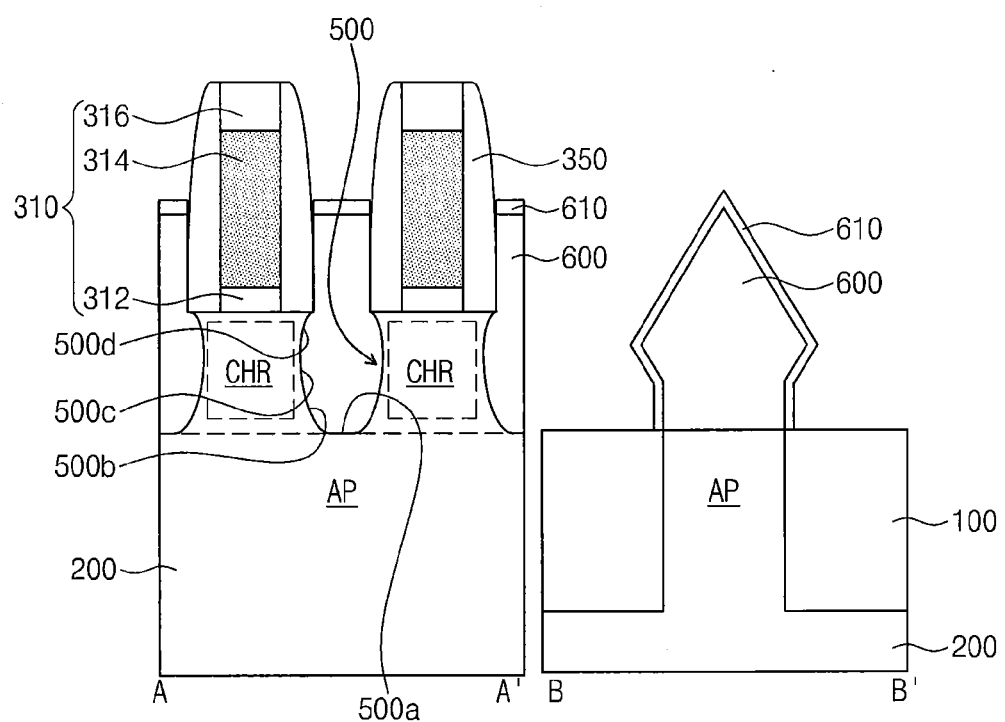

Referring to FIGS. 6A and 6B, source/drain patterns 600 may be formed on portions of the substrate 200 positioned at both sides of the gate patterns 310. The source/drain patterns 600 may be formed by epitaxial patterns formed in the second recess regions 500. The epitaxial patterns may be grown from the substrate 200 exposed by the second recess regions 500. The source/drain patterns 600 may include the same elements as the amorphization element. For example, the source/drain patterns 600 may include silicon-germanium. In the case where the source/drain patterns 600 include elements different from the amorphization element, the amorphization elements remaining in the substrate 200 during the formation of the amorphous portions 400 may serve as impurities in the source/drain patterns 600. According to example embodiments of the inventive concept, some of the amorphization elements may remain after the formation of the amorphous portions 400 and may be used to form the source/drain patterns 600. This makes it easier to form the source/drain patterns 600. The source/drain patterns 600 may be doped to have a second conductivity type. In some embodiments, the source/drain patterns 600 may be doped to have a first conductivity type. For example, in the case of NMOS transistors, the source/drain patterns 600 may be doped with phosphorus (P) or arsenic (As). In the case of PMOS transistors, the source/drain patterns 600 may be doped with boron (B). A capping layer 610 may be further formed on the source/drain patterns 600. The capping layer 610 may include silicon. The capping layer 610 may be doped to have the same type as that of the source/drain patterns 600. In some embodiments, the capping layer 610 may not be formed on the source/drain regions 600.

The source/drain patterns 600 may include different elements from those of the substrate 200. In the case where the semiconductor device is a PMOS transistor, the source/drain patterns 600 may be formed to have a lattice constant greater than that of the substrate 200, and thus, the source/drain patterns 600 may exert a compressive force to the channel region CHR below the gate pattern 310. Because the second recess regions 500 extend below the spacers 350, it is possible to increase a compressive force to be exerted to the channel region CHR from the source/drain patterns 600 in the recessed regions 500. For example, in the case where distances between the side surfaces 500c are substantially equal to each other, a volume of the source/drain pattern 600 may be increased by increasing a vertical length of the side surface 500c, decreasing a distance between the lower inclined surfaces 500b, and decreasing a distance between the upper inclined surfaces 500d. Such an increase in volume of the source/drain pattern 600 may make it possible to increase the compressive force to be exerted to the channel region CHR from the source/drain patterns 600, and consequently, increase mobility of holes in the channel region CHR. In other embodiments, in the case where the semiconductor device is an NMOS transistor, the source/drain patterns 600 may be formed to have a lattice constant less than that of the substrate 200, and thus, the source/drain patterns 600 may exert a tensile force to the channel region CHR. The tensile force to be exerted to the channel region CHR from the source/drain patterns 600 may allow for increasing mobility of electrons in the channel region CHR.

In example embodiments, the second recess region 500 may be configured in such a way that a distance between the lower inclined surfaces 500b and a distance between the upper inclined surfaces 500d are relatively short. For example, a lower portion of the source/drain pattern 600 may have a section shaped like those of the second recess regions 500 previously described with reference to FIGS. 5B through 5E. In the case where the source/drain pattern 600 has a rectangle-like section, it is possible to decrease a vertical change in length or width of the channel region CHR. For example, the channel region CHR may be formed to have a relatively uniform length or width. In operation of the semiconductor device, there is substantially no difference in mobility of holes or electrons between lower, intermediate, and upper portions of the channel region CHR. Accordingly, it is possible to improve electrical characteristics of the semiconductor device.

Figure 7A:
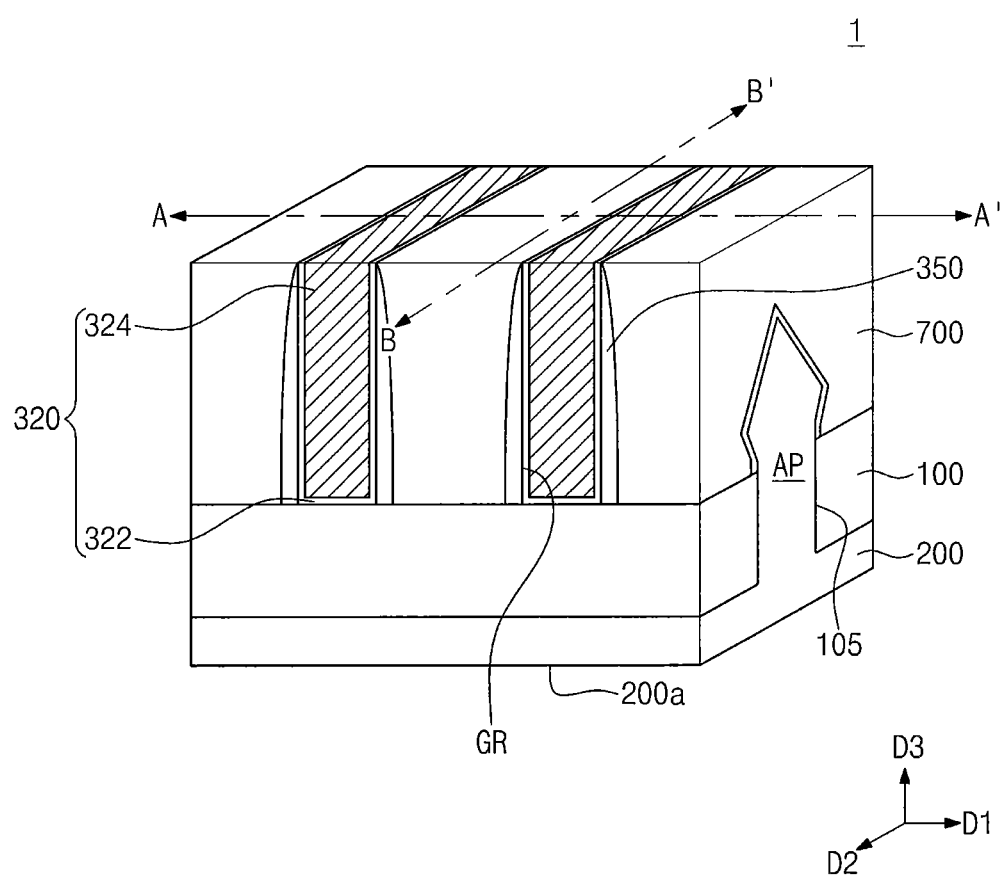
Figure 7B:
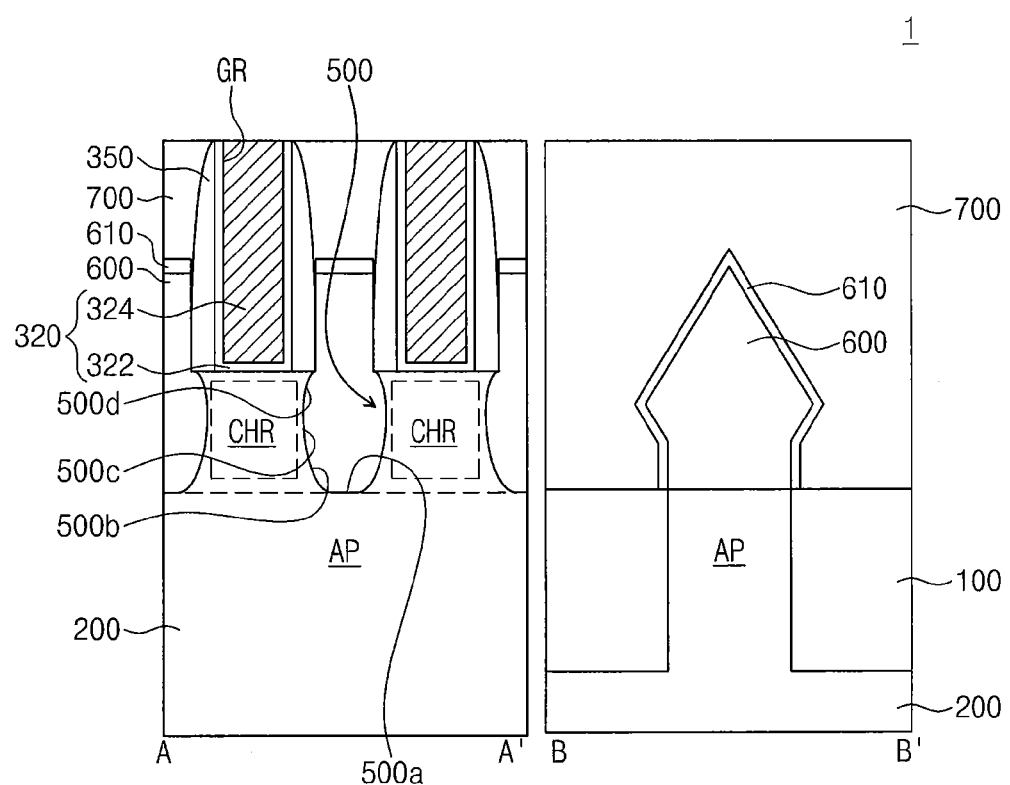

Referring to FIGS. 7A and 7B, an interlayer insulating layer 700 may be formed on the substrate 200 to cover the source/drain patterns 600. The formation of the interlayer insulating layer 700 may include forming an insulating layer on the source/drain patterns 600 and etching the insulating layer to expose top surfaces of the gate patterns 310. The interlayer insulating layer 700 may include a silicon oxide layer, a silicon nitride layer, a silicon oxynitride layer and/or a low-k dielectric layer.

The gate patterns 310 may be removed, and gates 320 may be formed on the channel regions CHR, respectively, of the substrate 200. For example, the removal of the gate patterns 310 may be performed to form gap regions GR between the spacers 350. The gap regions GR may be formed to expose the channel regions CHR of the active pattern AP. A gate insulating layer 322 may be conformally formed on the gap region GR. The gate insulating layer 322 may be formed of or include at least one high-k dielectric material. The gate insulating layer 322 may be formed to conformally cover the channel regions CHR and the spacers 350. Gate electrodes 324 may be formed on the gate insulating layer 322 to fill the gap regions GR. The gate electrodes 324 may be formed of or include a conductive metal nitride and/or a metal (e.g., titanium, tantalum, aluminum, tungsten, and so forth).

In certain embodiments, the gate patterns 310 of FIGS. 2A and 2B may be used as gate electrodes for the semiconductor device 1. In this case, the fabrication of the semiconductor device 1 may be performed without the removal of the gate patterns 310 and the formation of the gate 320, and the sacrificial gate pattern 314 may be formed to include at least one conductive material for the gate 320.

FIGS. 8A through 13A are perspective views illustrating a method of fabricating a semiconductor device according to example embodiments of the inventive concept. FIGS. 8B through 13B are sectional views taken along lines A-A' and B-B' of FIGS. 8A through 13A, respectively. For concise description, a previously described element may be identified by a similar or identical reference number without repeating an overlapping description thereof.

Figure 8A:
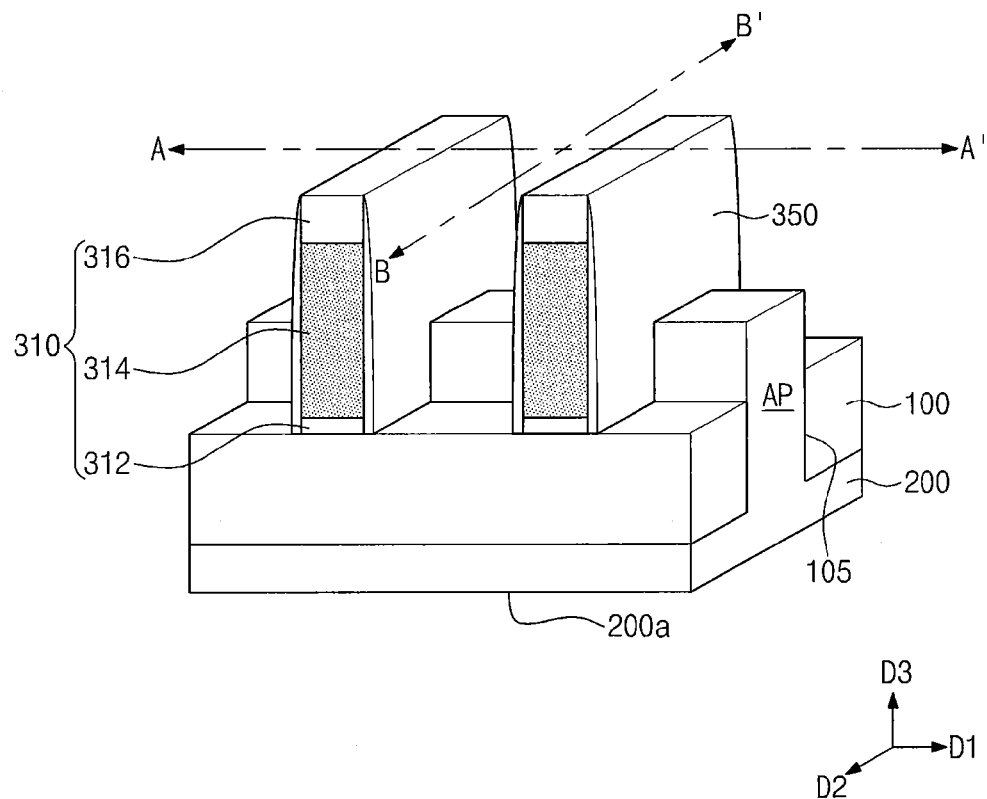
Figure 8B:
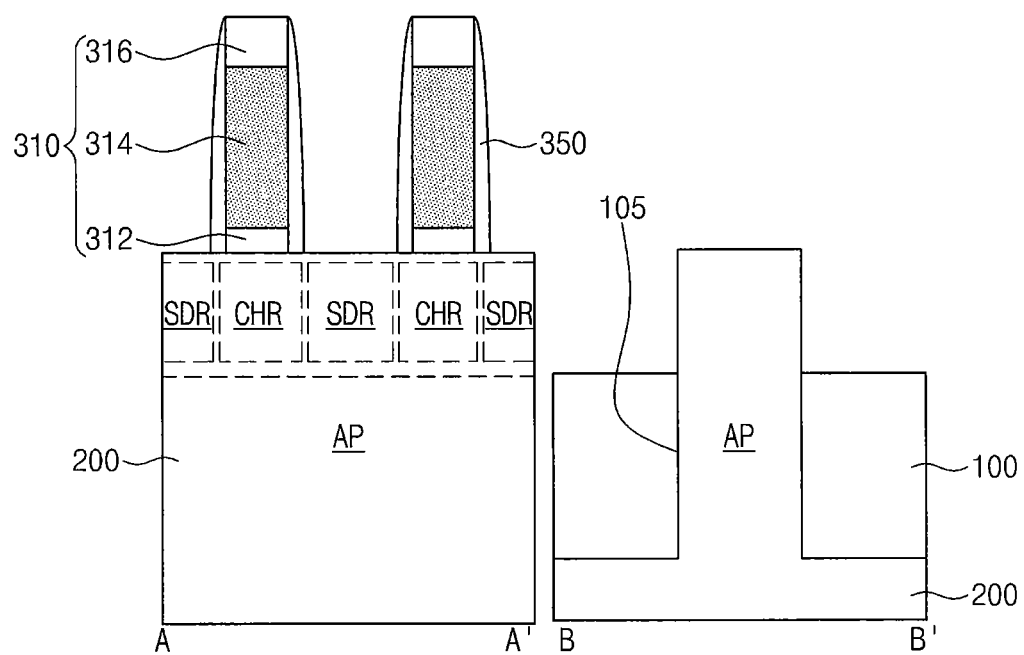

Referring to FIGS. 8A and 8B, the active pattern AP protruding from the substrate 200 may be formed. The device isolation pattern 100 may be formed to fill the trench 105. The active pattern AP and the device isolation pattern 100 may be formed using the same method as that previously described with reference to FIGS. 1A and 1B. The gate patterns 310 may be formed on the substrate 200 to cross the active pattern AP. The spacers 350 may be formed on side surfaces of the gate patterns 310. The gate patterns 310 and the spacers 350 may be formed using the same method as that previously described with reference to FIGS. 2A and 2B.

Figure 9A:
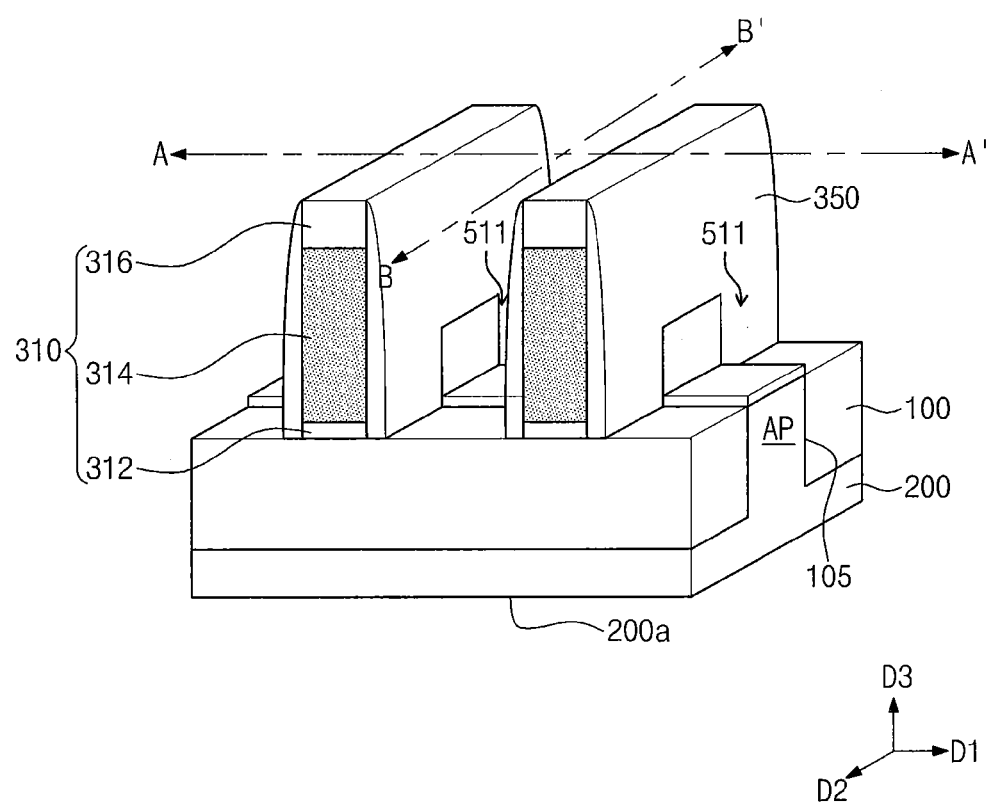
Figure 9B:
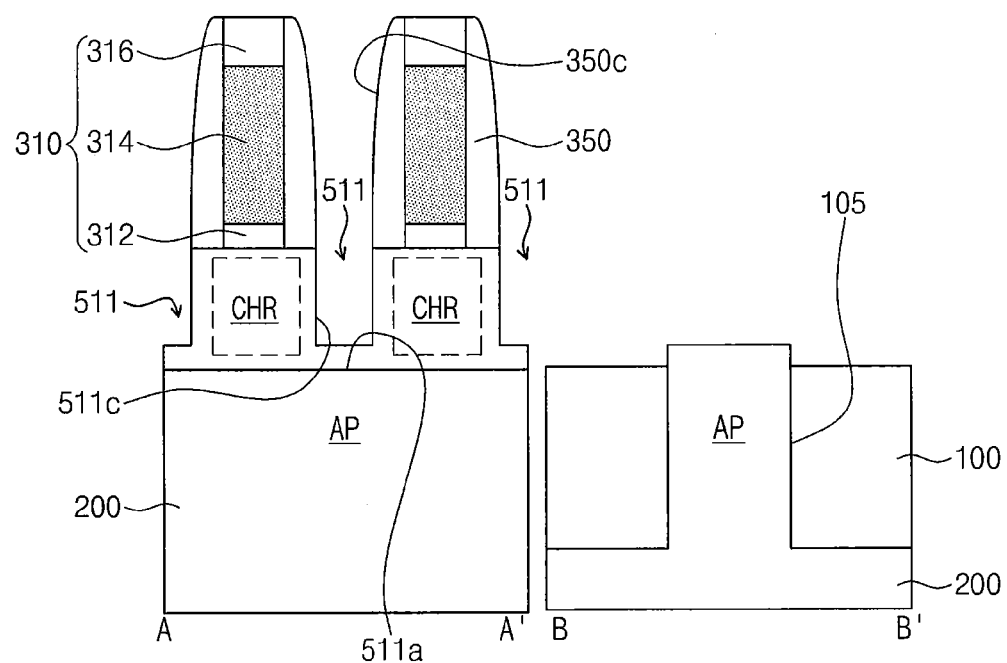

Referring to FIGS. 9A and 9B, a first etching process may be performed to form a first recess region 511 in portions the active pattern AP, which are positioned at both sides of the gate patterns 310. For example, the active pattern AP may be formed by anisotropically etching the active pattern AP using the gate patterns 310 and the spacers 350 as an etch mask. The side surfaces 500c of the first recess regions 511 may extend along the side surfaces 350c of the spacers 350. The first etching process may be performed in substantially the same or similar manner as that previously described with reference to FIGS. 4A and 4B.

Figure 10A:
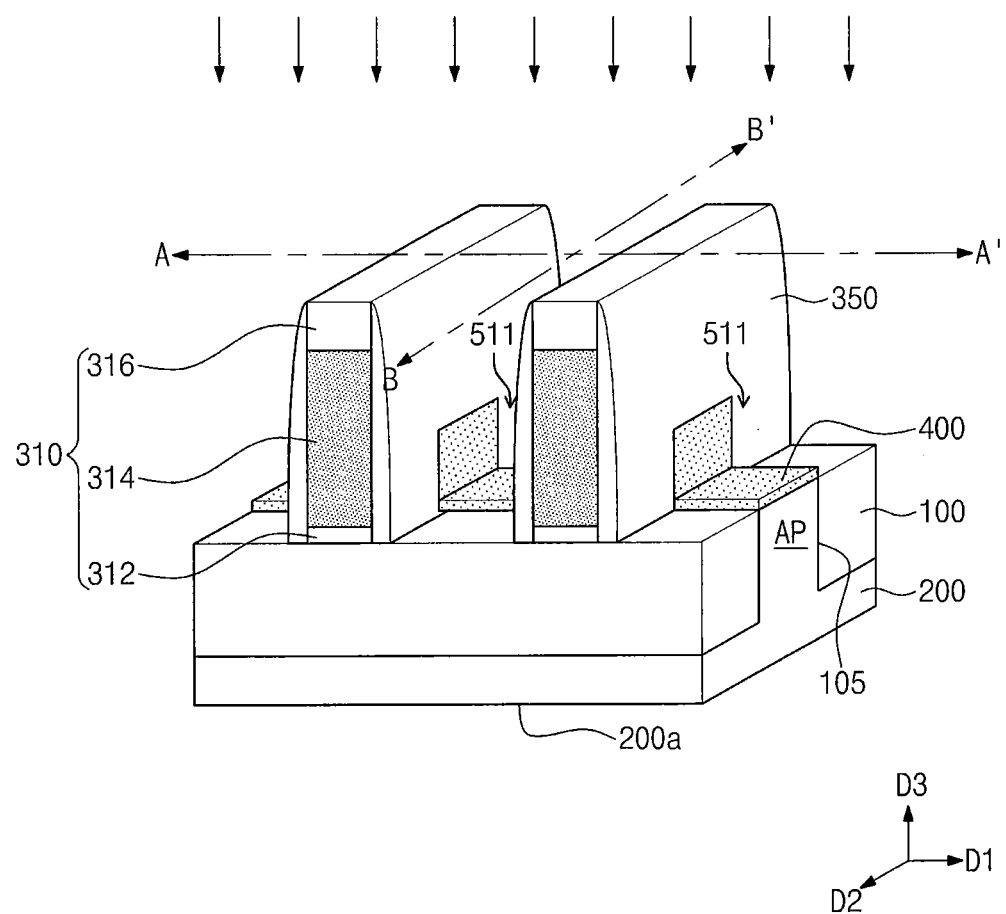
Figure 10B:
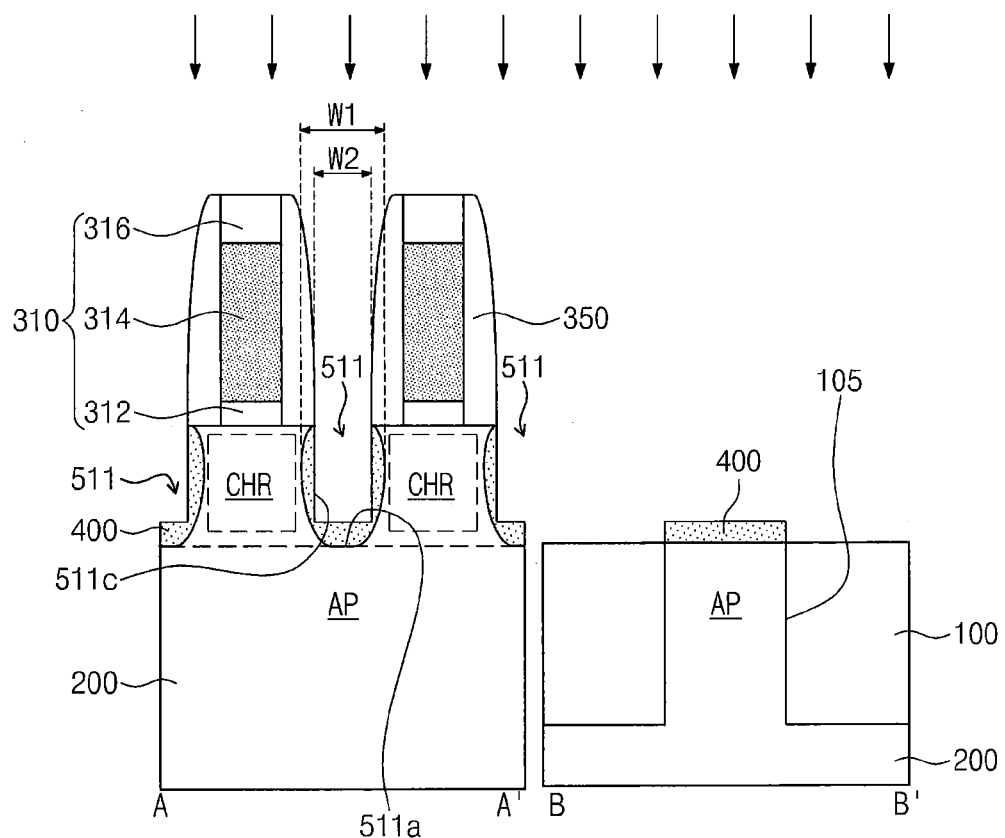

Referring to FIGS. 10A and 10B, the amorphous portions 400 may be formed in the first recess regions 511 of the active pattern AP. The amorphous portions 400 may be formed on bottom and side surfaces 511a and 511c of the first recess regions 511. The amorphous portions 400 may be formed by an ion injection process using the gate pattern 310 as an ion mask. The ion injection process may include injecting amorphization elements into the active pattern AP. The injection process of the amorphization elements may be performed using the same method as that previously described with reference to FIGS. 3A and 3B. The amorphous portions 400 may be formed in such a way that a portion thereof has a recessed 'U'-shaped section or a rectangle-shaped section. A width W1 of one of the amorphous portions 400 may be greater than a width W2 of a corresponding one of the first recess regions 511. At least a portion of the amorphous portion 400 may extend toward a region of the substrate 200 positioned below the spacers 350. For example, the side surfaces of the amorphous portions 400 may be positioned below the spacers 350.

Figure 11A:
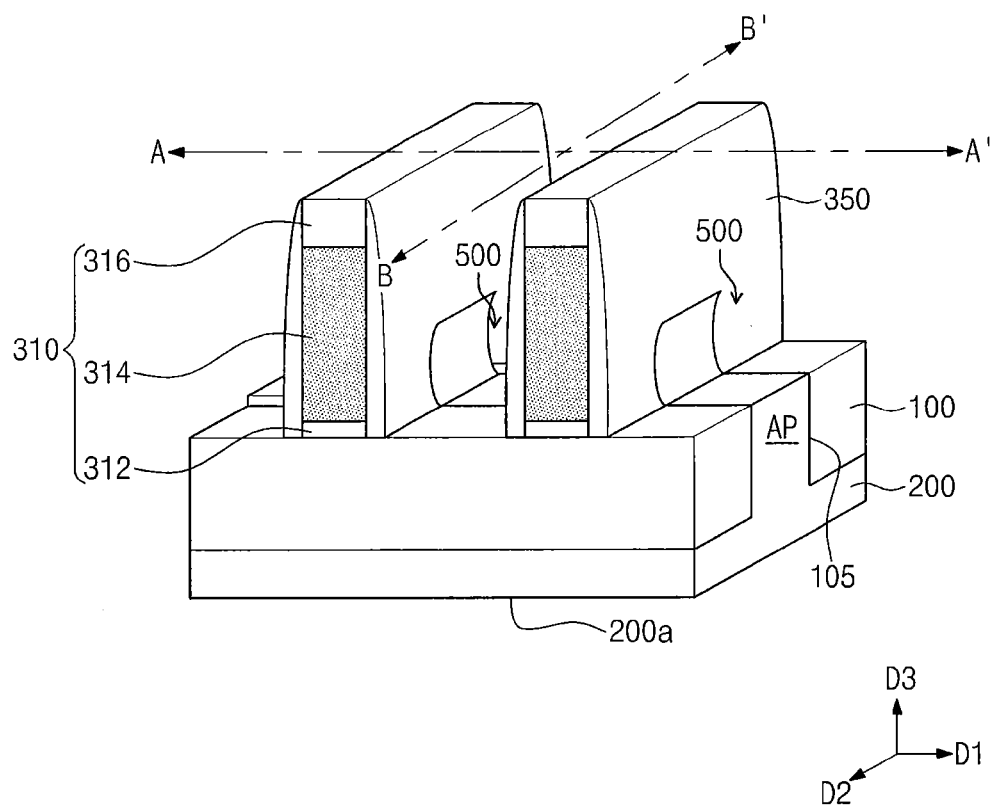
Figure 11B:
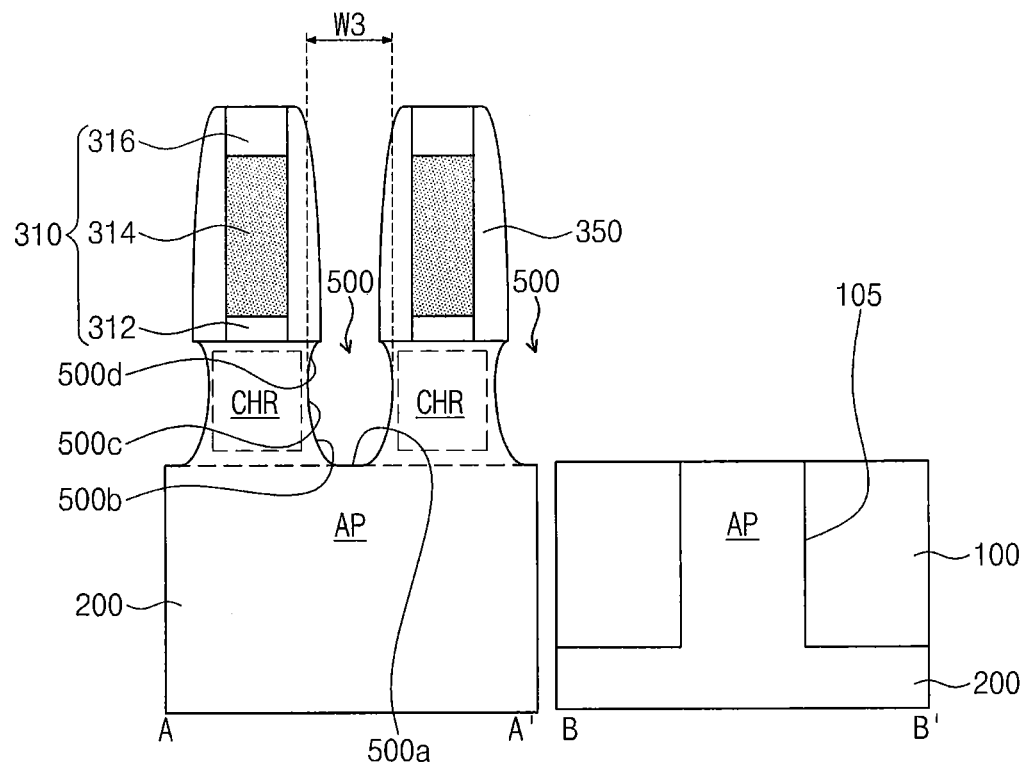

Referring to FIGS. 11A and 11B, a second etching process may be performed to remove the amorphous portions 400, and thus, the second recess regions 500 may be formed in the substrate 200. The second etching process may be performed in substantially the same or similar manner as that previously described with reference to FIGS. 5A and 5B. The second etching process may include isotropically etching the amorphous portions 400. For example, the etching of the amorphous portions 400 may be performed without any dependence on etching direction. In other words, an etch rate of the amorphous portions 400 may be substantially the same in all <111>, <100>, and <110> directions of the substrate 200. According to example embodiments of the inventive concept, as a result of the formation of the amorphous portions 400, the second recess regions 500 may be farther recessed toward the <111> direction of the substrate 200.

Each of the second recess regions 500 may include the bottom surface 500a, the side surface 500c, the lower inclined surface 500b, and the upper inclined surface 500d. As a result of the second etching process, the second recess regions 500 may be formed to have a width W3 greater than the width W2 of the first recess regions 511. The side surfaces 500c of the second recess regions 500 may be positioned below the spacers 350. The second recess regions 500 may be formed to have substantially the same section as those previously described with reference to FIGS. 5B through 5E. This makes it possible to increase the volume of the second recess region 500. Further, this may contribute to improve the uniformity in a distance between adjacent ones of the second recess regions 500 without dependence on a distance from the top surface of the substrate 200.

Figure 12A:
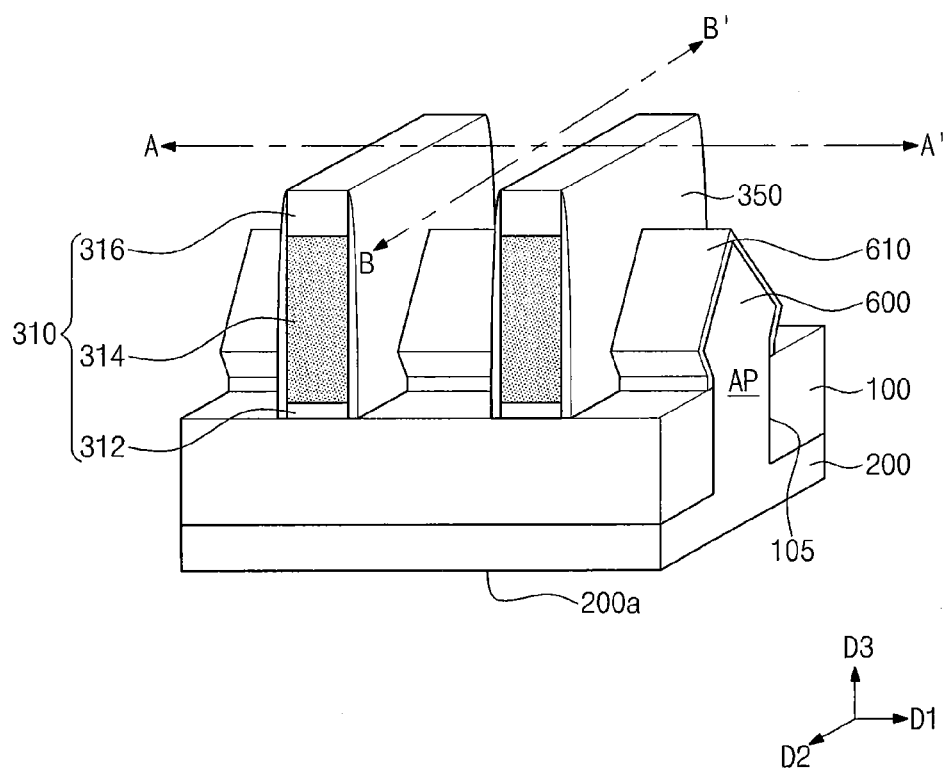
Figure 12B:
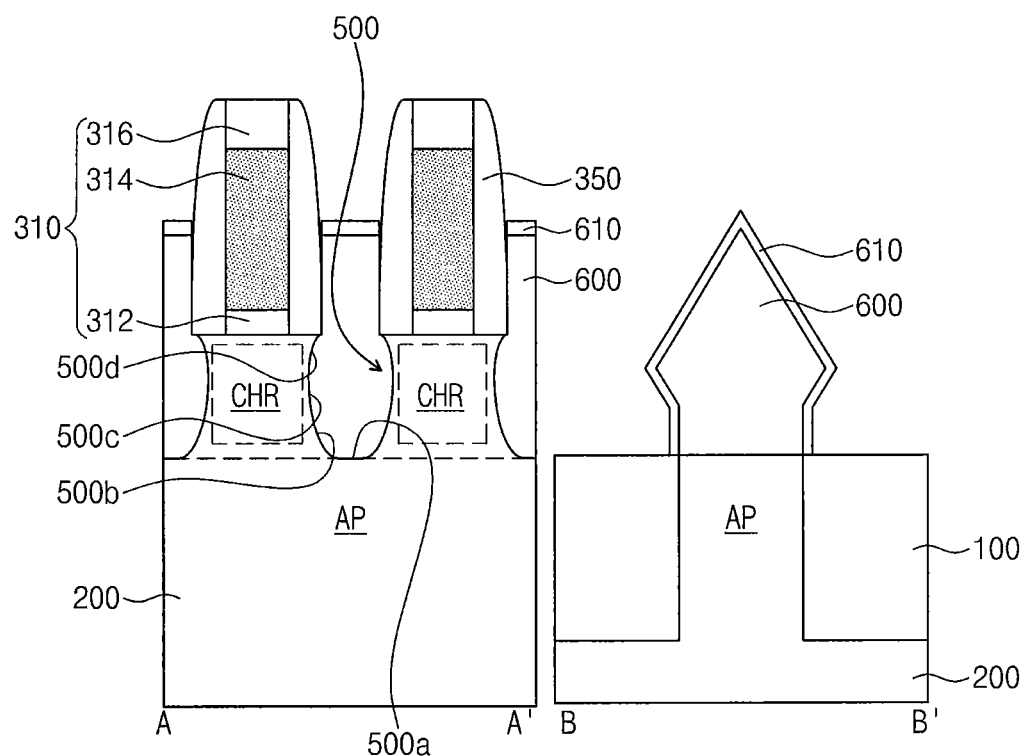

Referring to FIGS. 12A and 12B, the source/drain patterns 600 may be formed on portions of the substrate 200 positioned at both sides of the gate patterns 310. The source/drain patterns 600 may be formed using the same process as that described with reference to FIGS. 6A and 6B. For example, the source/drain patterns 600 may be formed by epitaxial patterns formed in the second recess regions 500. The epitaxial patterns may be grown from the substrate 200 exposed by the second recess regions 500. The source/drain patterns 600 may be doped to have a second conductivity type. In some embodiments, the source/drain patterns 600 may be doped to have a first conductivity type. The capping layer 610 may be further formed on the source/drain patterns 600. The capping layer 610 may be doped with the same dopants as that of the source/drain patterns 600. In some embodiments, the capping layer 610 may not be formed on the source/drain regions 600.

Figure 13A:
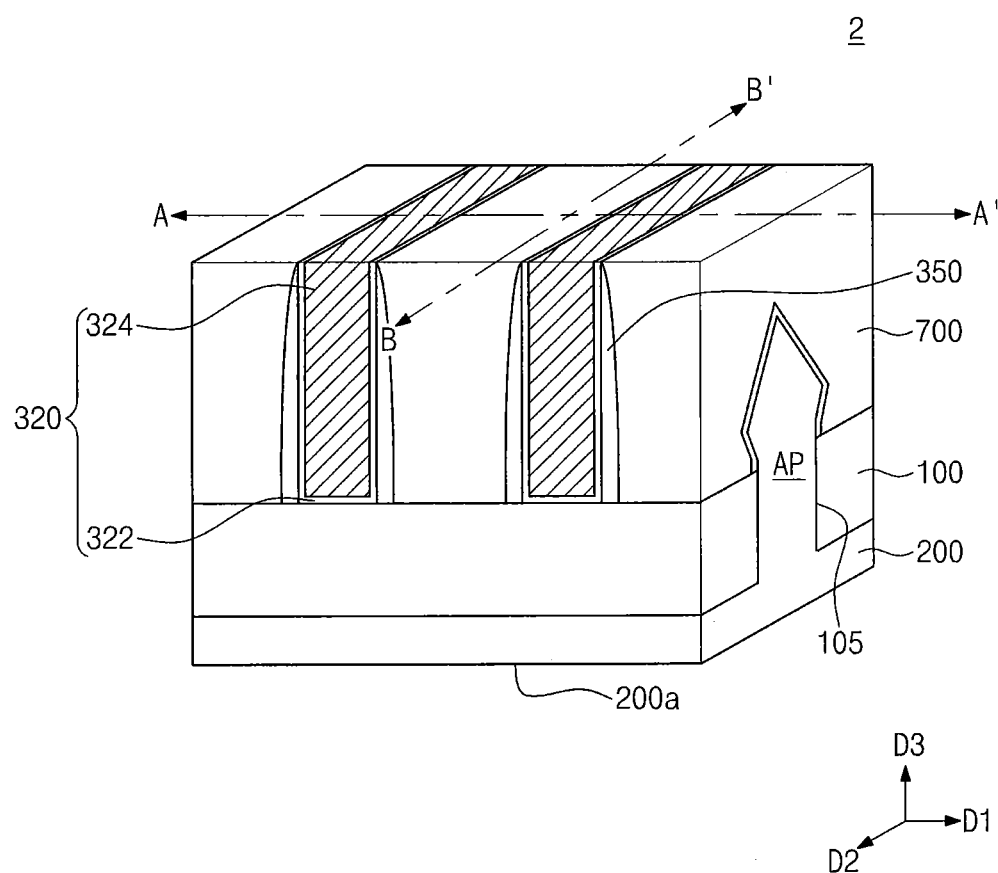
Figure 13B:
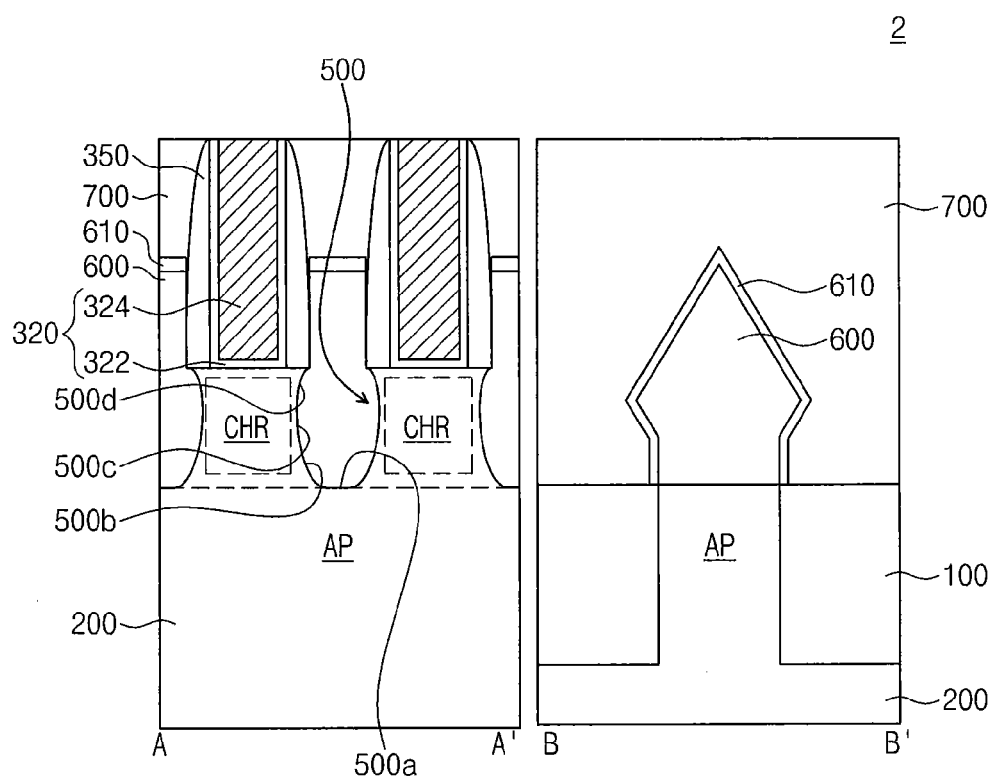

Referring to FIGS. 13A and 13B, the interlayer insulating layer 700 may be formed on the substrate 200 to cover the source/drain patterns 600. The gate patterns 310 may be removed, and then, the gates 320 may be formed on the channel regions CHR, respectively, of the substrate 200. As described with reference to FIGS. 7A and 7B, each of the gates 320 may include the gate insulating layer 322 and the gate electrode 324. As a result, a semiconductor device 2 may be formed.

The semiconductor devices according to the afore-described embodiments of the inventive concept may be used to realize a logic device or a memory device. If the semiconductor device is used to realize the memory device, the transistors of the semiconductor device may be formed on a peripheral circuit region of the memory device.

The semiconductor devices disclosed above may be encapsulated using various and diverse packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor device according to one of the above embodiments is mounted may further include at least one semiconductor device (e.g., a controller and/or a logic device) that controls the semiconductor device.

Figure 14:
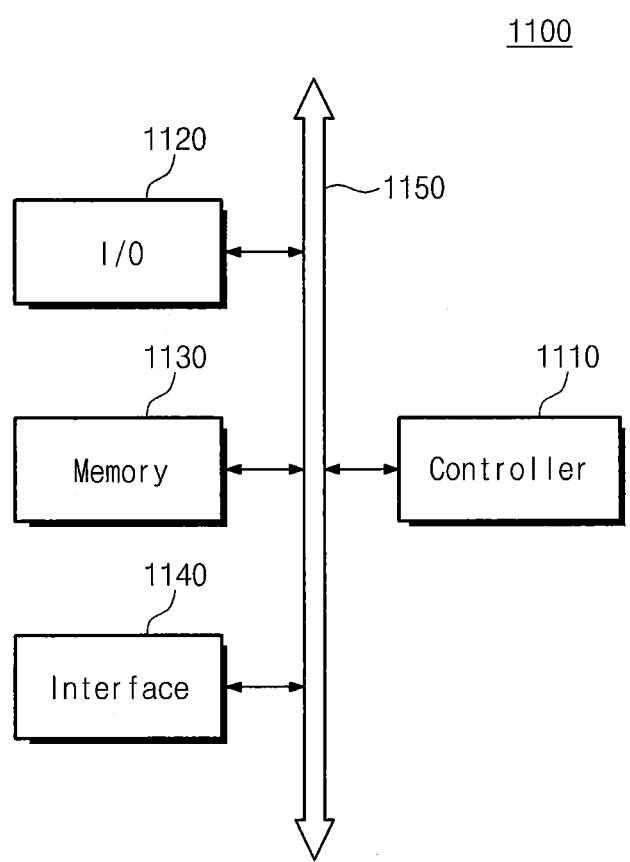
FIG. 14 is a schematic block diagram illustrating an example of electronic systems including at least one of the semiconductor devices according to example embodiments of the inventive concept.

FIG. 14 is a schematic block diagram illustrating an example of electronic systems including at least one of the semiconductor devices according to example embodiments of the inventive concept.

Referring to FIG. 14, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or other logic devices. The other logic devices may have a similar function to any one of the microprocessor, the digital signal processor and the microcontroller. At least one of the afore-described semiconductor devices may be configured to realize a logic device, which may be used as the controller 1110. The I/O unit 1120 may include a keypad, a keyboard or a display unit. The memory device 1130 may store data and/or commands. At least one of the afore-described semiconductor devices may be configured to realize a semiconductor memory device, which may be used as the memory device 1130. The memory device 1130 may further include another type of semiconductor memory device (e.g., a FLASH memory device, a magnetic memory device, a phase change memory device, a dynamic random access memory (DRAM) device and/or a static random access memory (SRAM) device). The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data by wireless communication.

Figure 15:
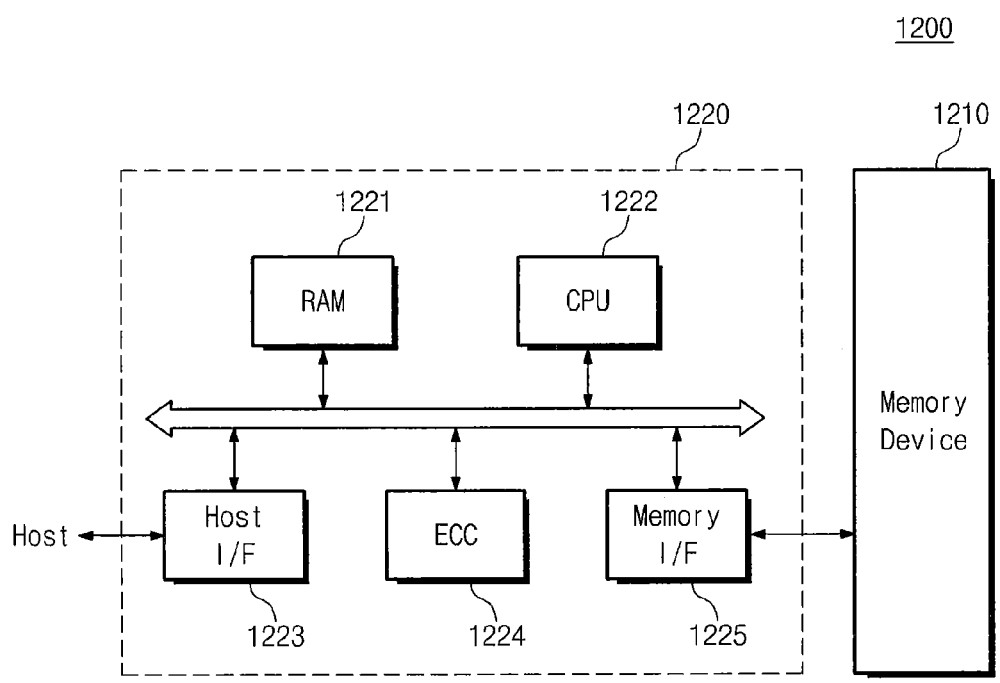
FIG. 15 is a schematic block diagram illustrating an example of memory cards including at least one of the semiconductor devices according to example embodiments of the inventive concept.

FIG. 15 is a schematic block diagram illustrating an example of memory cards including at least one of the semiconductor devices according to example embodiments of the inventive concept.

Referring to FIG. 15, a memory card 1200 according to example embodiments of the inventive concept may include a memory device 1210. At least one of the afore-described semiconductor devices may be configured to realize a semiconductor memory device, which may be used as the memory device 1210. The memory device 1210 may further include another type of semiconductor memory device (e.g., a FLASH memory device, a magnetic memory device, a phase change memory device, a dynamic random access memory (DRAM) device and/or a static random access memory (SRAM) device). The memory card 1200 may include a memory controller 1220 that controls data exchanging operations between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data, which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

According to example embodiments of the inventive concept, recess regions may be formed by etching amorphous portions. The etching of the amorphous portions may be performed to have substantially the same etch rate in two different directions. This may be used to control a shape of the amorphous portion and consequently control a shape of the recess region. The recess region may be laterally expanded in such a way that it is overlapped with a spacer, when viewed in a plan view, and thus, it is possible to increase a magnitude of a compressive or tensile force to be exerted to a channel region from a source/drain pattern. In the case where the recess region is expanded toward a <111> direction of a substrate, the source/drain patterns can be formed to have an increased volume. Accordingly, in operation, it is possible to increase the mobility of holes or electrons in the channel region.

The source/drain pattern may be formed to have a 'U'- or rectangle-shaped section. That is, the channel region may have a generally uniform width, without dependence on a distance from a top surface of the substrate. This makes it possible to improve electrical characteristics (e.g., reliability) of the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   providing a semiconductor substrate;
   forming an active pattern that protrudes from the semiconductor substrate;
   forming a gate pattern on the semiconductor substrate to cross the active pattern;
   forming spacers on sidewalls of the gate pattern;
   injecting amorphization elements into the active pattern to form amorphous portions in the active pattern at both sides of the gate pattern;
   etching the amorphous portions to form recess regions in the active pattern; and
   forming epitaxial patterns in the recess regions;
   wherein each of the recess regions comprises:
   a bottom surface having a {100} crystal plane;
   side surfaces having a {110} crystal plane;
   lower inclined surfaces having a {111} crystal plane and being provided between the bottom surface and the side surfaces; and
   upper inclined surfaces having a {111} crystal plane and being provided on the side surfaces.

2. The method of claim 1, wherein a vertical length of respective ones of the side surfaces is longer than a distance between both ends of respective ones of the lower inclined surfaces, and
   the both ends of respective ones of the lower inclined surfaces meet the side and bottom surfaces, respectively.

3. The method of claim 1, wherein the etching of the amorphous portions is performed in such a way that an etch rate of the amorphous portions is substantially the same in <111> and <100> directions of the semiconductor substrate.

4. The method of claim 1, wherein the etching of the amorphous portions is performed in such a way that an etch rate of the amorphous portions is substantially the same in <111> and <110> directions of the semiconductor substrate.

5. The method of claim 1, wherein, in each of the recess regions, the lower inclined surfaces are connected to each other through the bottom surface interposed therebetween.

6. The method of claim 1, wherein, in each of the recess regions, the upper inclined surfaces are connected to the lower inclined surfaces through the side surfaces interposed therebetween.

7. The method of claim 1, wherein the forming of the recess regions in the active pattern comprises:
   forming preliminary recess regions in the active pattern at both sides of the gate pattern, the preliminary recess regions having side surfaces extending along side surfaces of the spacers; and
   anisotropically etching the preliminary recess regions to increase widths of the preliminary recess regions.

8. The method of claim 1, wherein the epitaxial patterns contain a same element as the amorphization elements.

9. The method of claim 8, wherein the amorphization elements comprises germanium.

10. A method of fabricating a semiconductor device, comprising:
    forming a gate pattern on a semiconductor substrate;
    forming a spacer on a sidewall of the gate pattern;
    forming a recess region in the semiconductor substrate at a side of the spacer; and
    forming a source/drain pattern in the recess region,
    wherein the forming of the recess region comprises:
    etching the semiconductor substrate using the gate pattern and the spacer as a mask to form a first recess region;
    injecting an amorphization element through the first recess region to form an amorphous portion in the semiconductor substrate; and
    removing the amorphous portion to form a second recess region having a volume greater than that of the first recess region;
    wherein the second recess region comprises:
    a bottom surface having a {100} crystal plane;
    a side surface having a {110} crystal plane;
    a lower inclined surface having a {111} crystal plane and being provided between the bottom and side surfaces; and
    an upper inclined surface having a {111} crystal plane and being provided on the side surface.

11. The method of claim 10, wherein the amorphization element comprises germanium.

12. The method of claim 11, wherein the injecting of the amorphization element is performed at a dose ranging from about $1\times10^{11}$ atoms/cm$^2$ to about $1\times10^{17}$ atoms/cm$^2$.

13. The method of claim 10, wherein the forming of the source/drain pattern comprises growing an epitaxial pattern from the semiconductor substrate exposed by the recess region, and the source/drain pattern comprises a same element as the amorphization element.

14. A method of fabricating a semiconductor device, comprising:
    forming a pair of gate patterns on a semiconductor substrate;
    forming spacers on sidewalls of the gate patterns;
    forming an amorphous portion in the semiconductor substrate between the gate patterns;
    performing a first etching procedure to form a first recess region in the amorphous portion such that a distance between the spacers on the respective gate patterns is about equal to a width of the first recess region; and
    performing a second etching procedure to form a second recess region by removing the amorphous portion that remains after the first etching procedure such that the distance between the spacers on the respective gate patterns is less than a width of the second recess region;
    wherein the performing the second etching procedure comprises forming the second recess region in a space between the spacers on the respective gate patterns and the semiconductor substrate,
    wherein the second recess region comprises:
    a bottom surface;
    side surfaces;
    lower inclined surfaces between the bottom surface and side surfaces; and
    upper inclined surfaces on the side surfaces.

15. The method of claim 14, wherein the second etching procedure is performed in such a way that an etch rate of the amorphous portion is substantially the same in <111> and <100> directions of the semiconductor substrate.

16. The method of claim 14, wherein the etching of the second etching procedure is performed in such a way that an etch rate of the amorphous portion is substantially the same in <111> and <110> directions of the semiconductor substrate.

* * * * *